(12) United States Patent
Heo

(10) Patent No.: US 11,276,742 B2
(45) Date of Patent: Mar. 15, 2022

(54) DISPLAY DEVICE

(71) Applicant: LG Display Co., Ltd., Seoul (KR)

(72) Inventor: JoonYoung Heo, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 350 days.

(21) Appl. No.: 16/653,146

(22) Filed: Oct. 15, 2019

(65) Prior Publication Data

US 2020/0168693 A1 May 28, 2020

(30) Foreign Application Priority Data

Nov. 26, 2018 (KR) .................. 10-2018-0147146

(51) Int. Cl.
*H01L 27/32* (2006.01)
*H01L 51/56* (2006.01)
*H01L 51/52* (2006.01)

(52) U.S. Cl.
CPC ........ *H01L 27/3276* (2013.01); *H01L 27/322* (2013.01); *H01L 51/56* (2013.01); *H01L 51/5265* (2013.01); *H01L 2227/323* (2013.01)

(58) Field of Classification Search
CPC ............. H01L 27/3209; H01L 27/3211; H01L 51/5012
USPC ........................................................ 257/40
See application file for complete search history.

(56) References Cited

U.S. PATENT DOCUMENTS

| 8,049,420 | B2 | 11/2011 | Tamura et al. |
| 9,231,227 | B2 | 1/2016 | Weaver et al. |
| 2007/0133281 | A1* | 6/2007 | Fujita ..................... G11C 16/10 365/185.05 |
| 2011/0052836 | A1* | 3/2011 | Kim ....................... H01L 51/003 428/1.1 |
| 2014/0021499 | A1* | 1/2014 | Jang .................... H01L 51/5281 257/98 |
| 2020/0006445 | A1* | 1/2020 | Hong .................. H01L 51/5072 |

FOREIGN PATENT DOCUMENTS

| KR | 10-2010-0071725 A | 6/2010 |
| KR | 10-2013-0047600 A | 5/2013 |

* cited by examiner

*Primary Examiner* — Long K Tran
(74) *Attorney, Agent, or Firm* — Birch, Stewart, Kolasch & Birch, LLP

(57) ABSTRACT

A display device can include a substrate provided with a first subpixel, a first electrode including a first sub electrode provided on the first subpixel, an organic light emitting layer including first and second organic light emitting layers arranged on the first sub electrode and a second organic light emitting layer arranged on the second sub electrode, a second electrode arranged on the organic light emitting layer, and an auxiliary electrode arranged between the first organic light emitting layer on the first sub electrode and the second organic light emitting layer on the first sub electrode, wherein the auxiliary electrode is connected with the second electrode. Therefore, although the first subpixel has a two-stack structure, the organic light emitting layer can emit light in accordance with a voltage of one-stack, whereby overall power consumption can be reduced.

20 Claims, 15 Drawing Sheets

DISPLAY DEVICE

CROSS-REFERENCE TO RELATED APPLICATION

Pursuant to 35 U.S.C. § 119(a), this application claims the benefit of an earlier filing date and priority to Korean Patent Application No. 10-2018-0147146 filed in the Republic of Korea on Nov. 26, 2018, the contents of which are incorporated by reference herein in its entirety.

BACKGROUND

Technical Field

The present disclosure relates to a display device for displaying an image.

Description of the Related Art

With the advancement of the information age, the demand for a display device for displaying an image has increased with various forms. Therefore, various types of display devices such as a liquid crystal display (LCD) device, a light emitting display device, an organic light emitting display device, a micro light emitting display device, and a quantum dot light emitting display (QLED) device have been recently used.

For an organic light emitting display device, in the case that FMM (fine metal mask) technology is used to form red, green and blue pixels of an organic light emitting layer, it is possible to manufacture a small-to-medium panel by a mask shadow but it is difficult to apply a large area to this panel for a problem of drooping of a deposition mask. On the other hand, a white light emitting layer of an organic light emitting layer as well as red, green and blue fine patterns of the organic light emitting layer can be formed by a photo process using a photoresist. Also, the photo process using a photoresist can manufacture a panel of a large area as compared with FMM. However, since the white light emitting layer is embodied in a stack structure of at least two stacks to emit light of different colors, a problem occurs in that power consumption needed to emit light is high. This problem occurs more seriously in case of a display device, which requires ultra-high resolution, such as a head mounted display.

BRIEF SUMMARY

The present disclosure has been made in view of the above problems and other limitations associated with the related art, and it is an object of the present disclosure to provide a display device that can reduce power consumption needed to allow an organic light emitting layer to emit light.

In accordance with an aspect of the present disclosure, the above and other objects can be accomplished by the provision of a display device comprising a substrate provided with a first subpixel, a first electrode including a first sub electrode provided on the first subpixel, an organic light emitting layer including first and second organic light emitting layers arranged on the first sub electrode, a second electrode arranged on the organic light emitting layer, and an auxiliary electrode arranged between the first organic light emitting layer on the first sub electrode and the second organic light emitting layer on the first sub electrode, wherein the auxiliary electrode is electrically connected with the second electrode.

In the display device according to the present disclosure, as the first subpixel includes one anode and two cathodes connected with each other, the organic light emitting layer provided in the first subpixel can emit light in accordance with a voltage of one-stack even in case of a two-stack structure, whereby overall power consumption can be reduced.

In addition to the effects of the present disclosure as mentioned above, additional objects and features of the present disclosure will be clearly understood by those skilled in the art from the following description of the present disclosure.

BRIEF DESCRIPTION OF THE DRAWINGS

The above and other objects, features and other advantages of the present disclosure will be more clearly understood from the following detailed description taken in conjunction with the accompanying drawings, in which:

FIG. 5d is a brief cross-sectional view taken along line of FIG. 5a;

DETAILED DESCRIPTION OF THE EMBODIMENTS

Figure 1:
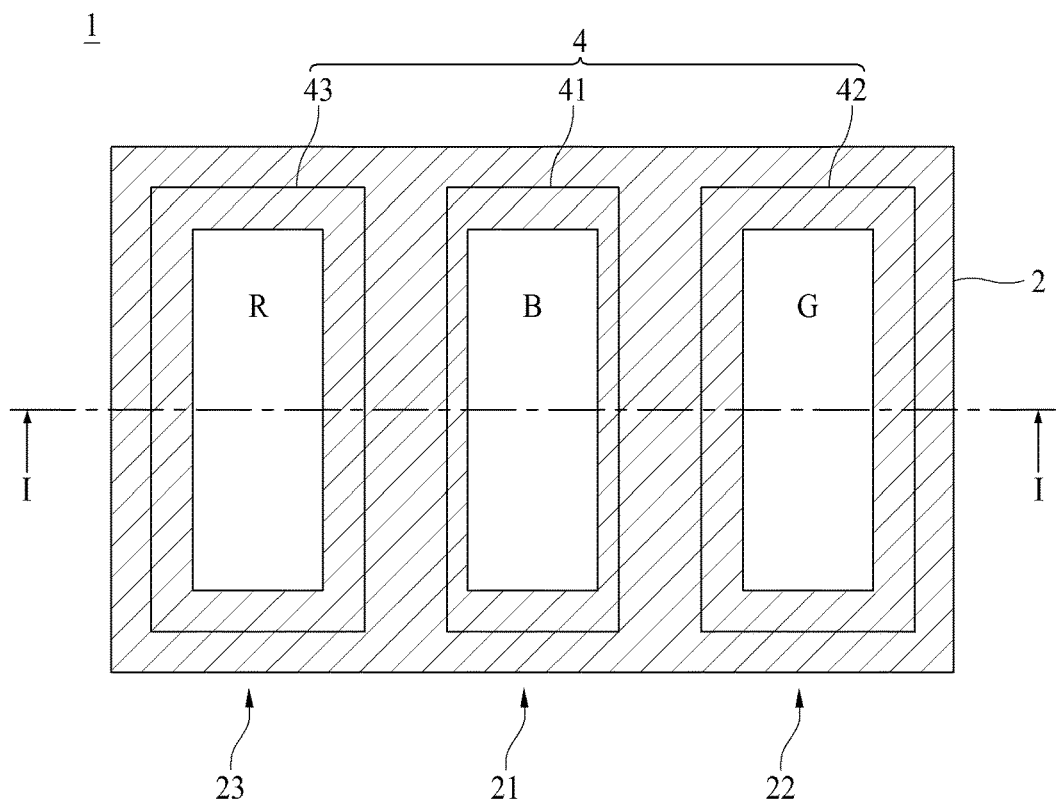
FIG. 1 is a brief plane view illustrating a display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when the position relationship is described as 'upon-%', 'above~-, 'below-', and 'next to-', one or more portions can be arranged between two other portions unless 'just' or 'direct' is used.

It will be understood that, although the terms "first", "second", etc. can be used herein to describe various elements, these elements should not be limited by these terms. These terms are only used to partition one element from another. For example, a first element could be termed a second element, and, similarly, a second element could be termed a first element, without departing from the scope of the present disclosure.

In describing elements of the present disclosure, the terms "first", "second", etc. can be used. These terms are intended to identify the corresponding elements from the other elements, and basis, order, or number of the corresponding elements are not limited by these terms. The expression that an element is "connected" or "coupled" to another element should be understood that the element can directly be connected or coupled to another element but can indirectly be connected or coupled to another element unless specially mentioned, or a third element can be interposed between the corresponding elements.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, the embodiments of the display device according to the present disclosure will be described in detail with reference to the accompanying drawings. Wherever possible, the same reference numbers will be used throughout the drawings to refer to the same or like parts.

Figure 2:
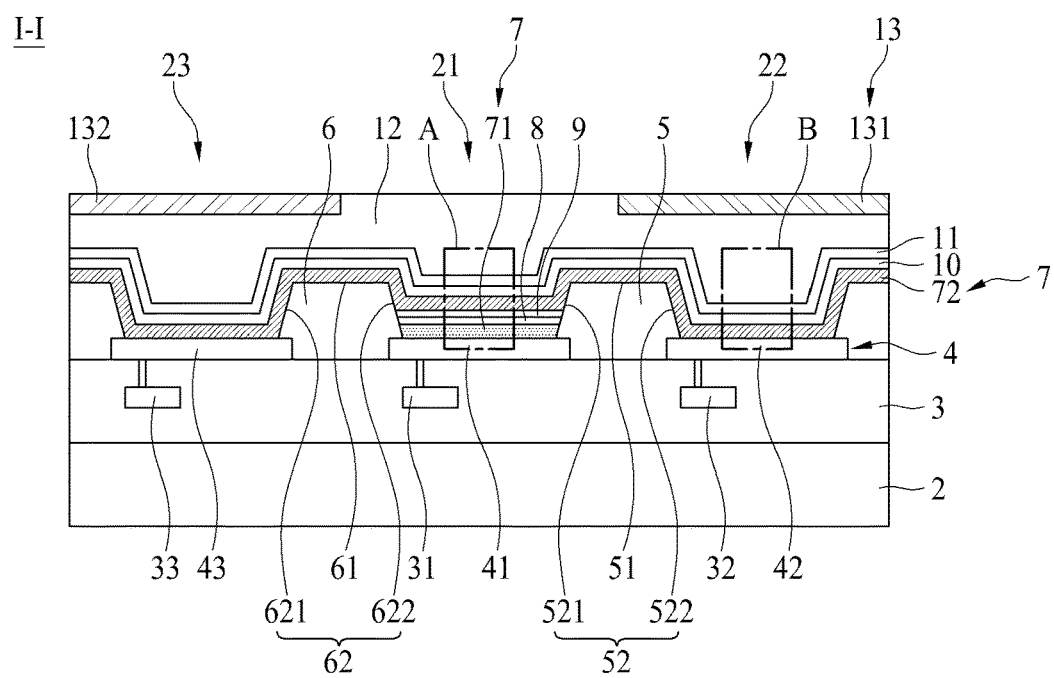
FIG. 2 is a brief cross-sectional view taken along line I-I shown in FIG. 1.
Figure 3:
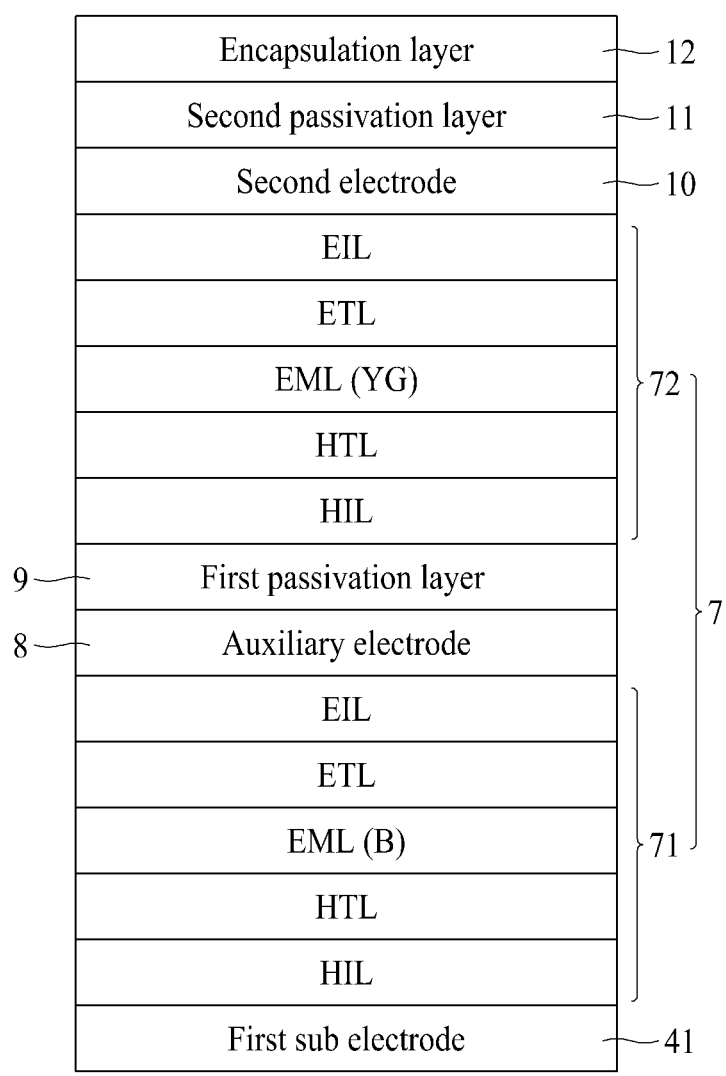
FIG. 3 is a brief structured view illustrating a part A shown in FIG. 2.
Figure 4:
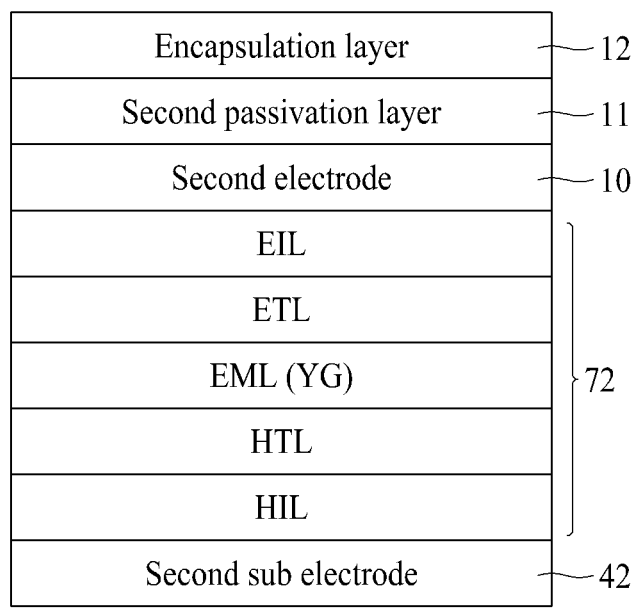
FIG. 4 is a brief structured view illustrating a part B shown in FIG. 2.
Figure 5A:
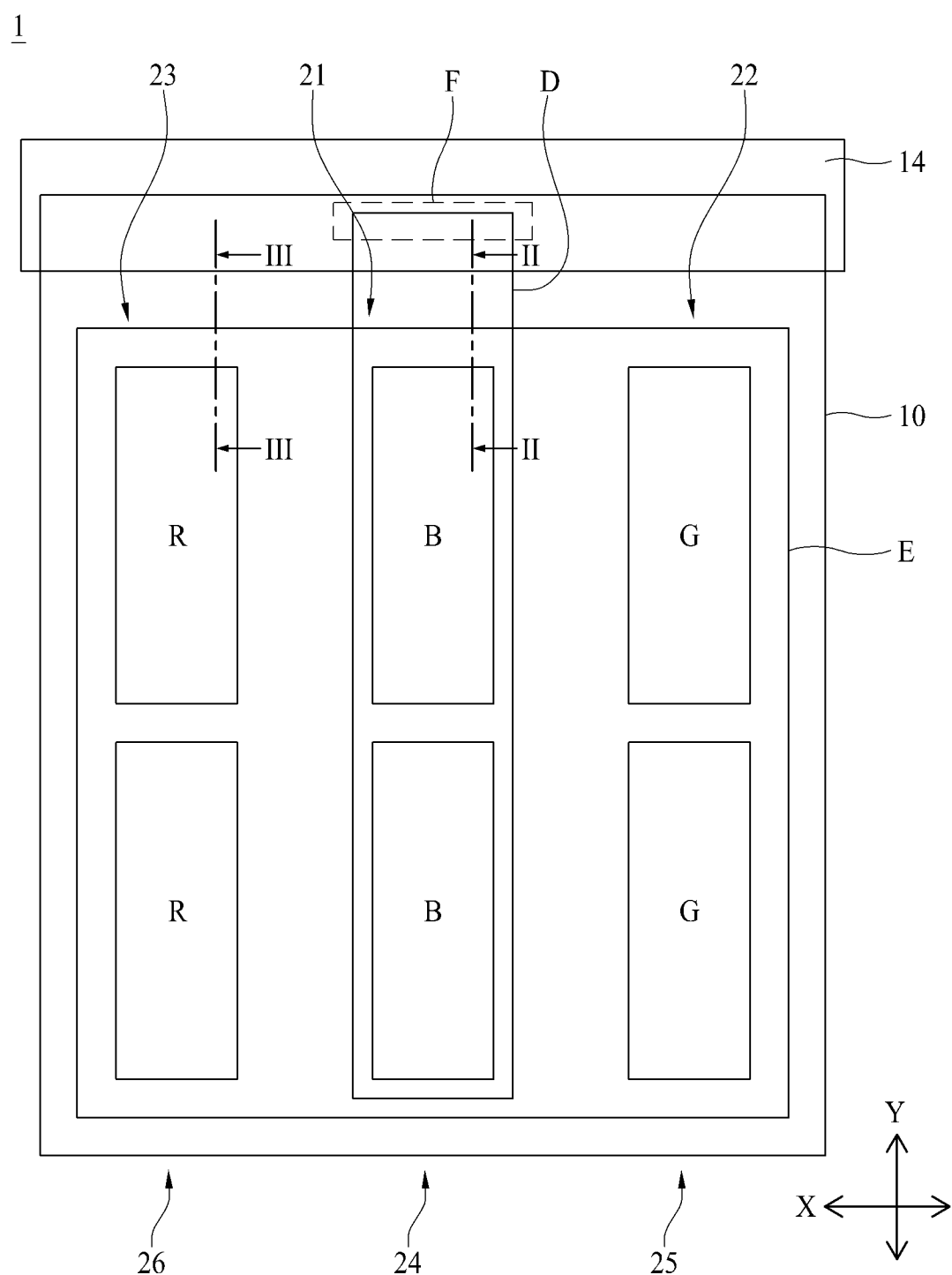
FIG. 5a is a brief view illustrating an example that an auxiliary electrode and a second electrode of a display device according to one embodiment of the present disclosure are connected to a voltage supply portion.
Figure 5B:
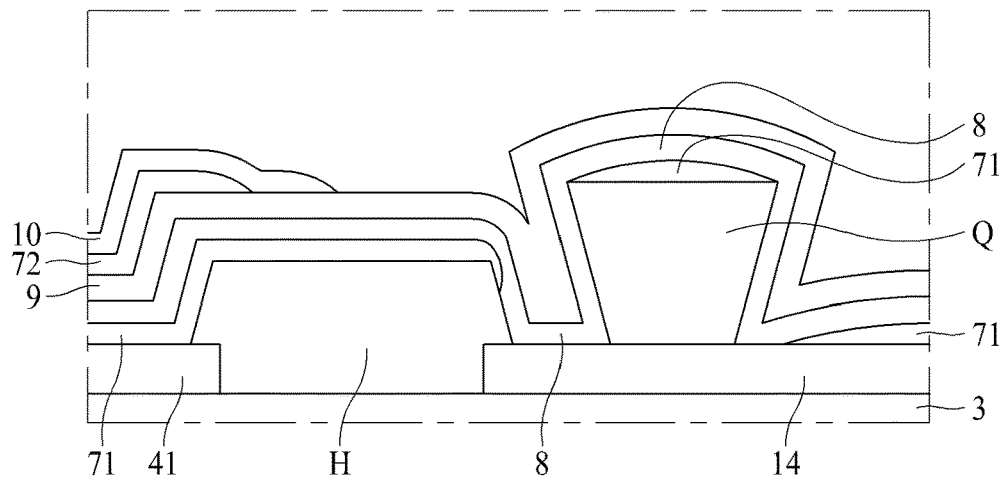
FIGS. 5b and 5c are brief cross-sectional views taken along line II-II of FIG. 5a illustrating embodiments that an auxiliary electrode is connected to a voltage supply portion.
Figure 5C:
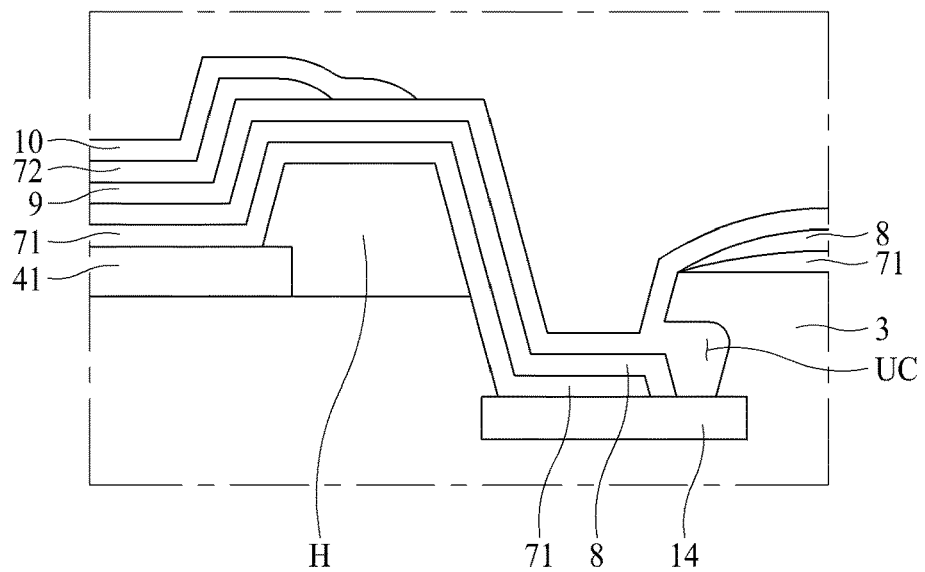

FIG. 1 is a brief plane view illustrating a display device according to one embodiment of the present disclosure, FIG. 2 is a brief cross-sectional view taken along line I-I shown in FIG. 1, FIG. 3 is a brief structured view illustrating a part A shown in FIG. 2, FIG. 4 is a brief structured view illustrating a part B shown in FIG. 2, FIG. 5a is a brief view illustrating an example that an auxiliary electrode and a second electrode of a display device according to one embodiment of the present disclosure are connected to a voltage supply portion, and FIGS. 5b and 5c are brief cross-sectional views taken along line II-II of FIG. 5a illustrating embodiments that an auxiliary electrode is connected to a voltage supply portion. All the components of the display device according to all embodiments of the present disclosure are operatively coupled and configured.

Referring to FIGS. 1 and 2, the display device 1 according to one embodiment of the present disclosure comprises a substrate 2, a circuit element layer 3, a first electrode 4, a first bank 5, a second bank 6, an organic light emitting layer 7, an auxiliary electrode 8, a first passivation layer 9, a second electrode 10, a second passivation layer 11, an encapsulation layer 12, and a color filter 13.

The substrate 2 can be a plastic film, a glass substrate, or a semiconductor substrate such as silicon. The substrate 2 can be made of a transparent material or an opaque material.

A first subpixel 21, a second subpixel 22 and a third subpixel 23 are provided on the substrate 2. The second subpixel 22 according to one example can be arranged to be adjacent to one side of the first subpixel 21. The third subpixel 23 according to one example can be arranged to be adjacent to the other side of the first subpixel 21. Therefore, the second subpixel 22 and the third subpixel 23 can be arranged in parallel at both sides of the first subpixel 21.

The first subpixel 21 can be provided to emit blue (B) light, the second subpixel 22 can be provided to emit green (G) light, and the third subpixel 23 can be provided to emit red (R) light, but these subpixels are not limited to this case and can emit light of various colors including white. Also, an arrangement sequence of the subpixels 21, 22 and 23 can be changed in various ways. For example, the first subpixel 21 can be provided to emit blue (B) light, the second subpixel 22 can be provided to emit red (R) light, and the third subpixel 23 can be provided to emit green (G) light.

Each of the first subpixel 21, the second subpixel 22 and the third subpixel 23 can be provided with the first electrode 4, the organic light emitting layer 7, the second electrode 10, and the second passivation layer 11.

The display device 1 according to one embodiment of the present disclosure is provided in a top emission method in which emitted light is emitted to a top portion, and therefore an opaque material can be used as a material of the substrate 2. However, the display device 1 according to one embodiment of the present disclosure can be provided in a bottom emission method in which emitted light is emitted to a bottom portion, without limitation to the top emission method.

The circuit element layer 3 is arranged on one surface of the substrate 2. A circuit element comprising a plurality of thin film transistors 31, 32 and 33, various types of signal lines, and a capacitor is provided on the circuit element layer 3 per each of the subpixels 21, 22 and 23. The signal lines can include gate lines, data lines, power lines and reference lines, and the thin film transistors 31, 32 and 33 can include a switching thin film transistor, a driving thin film transistor, and a sensing thin film transistor. The subpixels 21, 22 and 23 are defined by a crossing structure of gate lines and data lines.

The switching thin film transistor is switched in accordance with a gate signal supplied to the gate line and serves to supply a data voltage supplied from the data line to the driving thin film transistor.

The driving thin film transistor is switched in accordance with the data voltage supplied from the switching thin film transistor to generate a data current from a power source supplied from the power line and serves to supply the generated data current to the first electrode 4.

The sensing thin film transistor serves to sense a threshold voltage deviation of the driving thin film transistor, which is a cause of image degradation, and supplies a current of the driving thin film transistor to the reference line in response to a sensing control signal supplied from the gate line or a separate sensing line.

The capacitor serves to maintain the data voltage supplied to the driving thin film transistor for one frame and is connected to each of a gate terminal and a source terminal of the driving thin film transistor.

A first thin film transistor 31, a second thin film transistor 32 and a third thin film transistor 33 are arranged in the circuit element layer 3 separately for each of the subpixels 21, 22 and 23. The first thin film transistor 31 according to one example can be connected to a first sub electrode 41 arranged on the first subpixel 21 to apply a driving voltage for emitting light of a color corresponding to the first subpixel 21.

The second thin film transistor 32 according to one example can be connected to a second sub electrode 42 arranged on the second subpixel 22 to apply a driving voltage for emitting light of a color corresponding to the second subpixel 22.

The third thin film transistor 33 according to one example can be connected to a third sub electrode 43 arranged on the third subpixel 23 to apply a driving voltage for emitting light of a color corresponding to the third subpixel 23.

Each of the first subpixel 21, the second subpixel 22 and the third subpixel 23 according to one example supplies a predetermined current to an organic light emitting layer in accordance with the data voltage of the data line when a gate signal from the gate line is input thereto using each of the thin film transistors 31, 32 and 33. For this reason, the organic light emitting layer of each of the first subpixel 21, the second subpixel 22 and the third subpixel 23 can emit light with a predetermined brightness in accordance with the predetermined current.

The first electrode 4 is formed on the circuit element layer 3. The first electrode 4 according to one example can be formed to include a metal material of high reflectivity such as a deposited structure (Ti/Al/Ti) of aluminum and titanium, a deposited structure (ITO/Al/ITO) of aluminum and ITO, an APC alloy, and a deposited structure (ITO/APC/ITO) of APC alloy and ITO. The APC alloy is an alloy of silver (Ag), palladium (Pb), and Copper (Cu). The first electrode 4 can be an anode. The first electrode 4 can include a first sub electrode 41, a second sub electrode 42 and a third sub electrode 43.

The first sub electrode 41 can be provided on the first subpixel 21. The first sub electrode 41 can be formed on the circuit element layer 3. The first sub electrode 41 is connected to a source electrode of the first thin film transistor 31 through a contact hole that passes through the circuit element layer 3.

The second sub electrode 42 can be provided on the second subpixel 22. The second sub electrode 42 can be formed on the circuit element layer 3. The second sub electrode 42 is connected to a source electrode of the second thin film transistor 32 through a contact hole that passes through the circuit element layer 3.

The third sub electrode 43 can be provided on the third subpixel 23. The third sub electrode 43 can be formed on the circuit element layer 3. The third sub electrode 43 is connected to a source electrode of the third thin film transistor 33 through a contact hole that passes through the circuit element layer 3.

In this case, the first to third thin film transistors 31, 32 and 33 can be N-type TFTs.

If the first to third thin film transistors 31, 32 and 33 are made of P-type TFTs, each of the first to third sub electrodes 41, 42 and 43 can be connected to a drain electrode of each of the first to third thin film transistors 31, 32 and 33.

In other words, each of the first to third sub electrodes 41, 42 and 43 can be connected to a source electrode or a drain electrode in accordance with types of the first to third transistors 31, 32 and 33.

Since the display device 1 according to one embodiment of the present disclosure is provided in a top emission method, the first to third sub electrodes 41, 42 and 43 can include a reflective material for reflecting light emitted from the organic light emitting layer 7 to a top portion. In this case, the first to third sub electrodes 41, 42 and 43 can be made of a deposited structure of a transparent electrode formed of a transparent conductive material and a reflective electrode formed of the reflective material. As a separate transparent electrode is additionally provided below the reflective electrode, each of the first to third sub electrodes 41, 42 and 43 can be made of a three-layered structure in which the separate transparent electrode, the reflective electrode and the transparent electrode are sequentially deposited.

At this time, the reflective electrode provided in the first subpixel 21, the reflective electrode provided in the second subpixel 22 and the reflective electrode provided in the third subpixel 23 can be formed of the same material to have the same thickness.

Likewise, the transparent electrode provided in the first subpixel 21, the transparent electrode provided in the second subpixel 22 and the transparent electrode provided in the third subpixel 23 can be formed of the same material to have the same thickness. However, without limitation to this case, the thicknesses of the transparent electrodes provided in the subpixels 21, 22 and 23 can be different from one another to control a spaced distance of the respective sub electrodes 41, 42 and 43 from the second electrode 10. For example, if the display device is embodied using microcavity characteristic, the thicknesses of the transparent electrodes can be different from one another. The microcavity characteristic means that reinforcing interference occurs to amplify light if the distance between the reflective electrode of the first electrode 4 and the second electrode 10 becomes an integer multiple of a half wavelength $\lambda 2$ of light emitted from each of the subpixels 21, 22 and 23 and an amplified level of light is continuously increased to improve external extraction efficiency of light if the reflection and re-reflection are repeated as above. If the display device is embodied to have the microcavity characteristic, the second electrode 10 can include a semi-transparent electrode.

The display device 1 according to one embodiment of the present disclosure can be provided in a bottom emission method. In this case, at least one of an auxiliary electrode 8 arranged in the organic light emitting layer 7 and the second electrode 10 arranged on the organic light emitting layer 7 can reflect light emitted from the organic light emitting layer 7 to a bottom portion. If the display device 1 according to one embodiment of the present disclosure is provided in a bottom emission method, the color filter 13 arranged above the organic light emitting layer 7 in FIG. 2 can be arranged below the organic light emitting layer 7.

Referring to FIGS. 1 and 2 again, the first bank 5 is provided between the first sub electrode 41 and the second sub electrode 42. The first bank 5 according to one example is to partition the first subpixel 21 and the second subpixel 22 from each other. The first bank 5 serves to define a subpixel, that is, a light emitting area. Also, an area where the first bank 5 is formed can be defined as a non-light emitting area because the area does not emit light. The first bank 5 can be formed of an organic film such as acryl resin, epoxy resin, phenolic resin, polyamide resin, and polyimide resin. The organic light emitting layer 7 is formed on the first electrode 4 and the first bank 5.

Referring to FIG. 2, the first bank 5 can include an upper surface 51 and an inclined surface 52. The inclined surface 52 can include a first inclined surface 521 and a second inclined surface 522.

The upper surface 51 of the first bank 5 is a surface placed on the top of the first bank 5.

The first inclined surface 521 of the first bank 5 is a surface extended from the upper surface 51 to an upper surface of the first sub electrode 41. Therefore, the first inclined surface 521 can have a predetermined angle with the upper surface of the first sub electrode 41. The predetermined angle can be greater than 50° and less than 90° as a width of the bank becomes narrow in accordance with high resolution of the display device. A width of the bank can become narrow as the distance between subpixel areas becomes narrow.

The second inclined surface 522 of the first bank 5 is a surface extended from the upper surface 51 to an upper surface of the second sub electrode 42. Therefore, the second inclined surface 522 can have a predetermined angle with the upper surface of the second sub electrode 42. An angle between the second inclined surface 522 and the upper surface of the second sub electrode 42 can be the same as that between the first inclined surface 521 and the upper surface of the first sub electrode 41.

Referring to FIG. 2, the display device 1 according to one embodiment of the present disclosure can further include a second bank 6.

The second bank 6 is provided between the first sub electrode 41 and the third sub electrode 43. The second bank 6 according to one example is to partition the first sub pixel 21 and the third subpixel 23 from each other. The second bank 6 serves to define a subpixel, that is, a light emitting area. Also, an area where the second bank 6 is formed can be defined as a non-light emitting area because the area does not emit light. The second bank 6 can be formed of the same material as that of the first bank 5. The organic light emitting layer 7 is formed on the first electrode 4 and the second bank 6.

Referring to FIG. 2, the second bank 6 can include an upper surface 61 and an inclined surface 62. The inclined surface 62 can include a first inclined surface 621 and a second inclined surface 622.

The upper surface 61 of the second bank 6 is a surface placed on the top of the second bank 6.

The first inclined surface 621 of the second bank 6 is a surface extended from the upper surface 61 to the upper surface of the third sub electrode 43. Therefore, the first inclined surface 621 can have a predetermined angle with the upper surface of the third sub electrode 43. The predetermined angle can be greater than 50° and less than 90° as a width of the bank becomes narrow in accordance with high resolution of the display device.

The second inclined surface 622 of the second bank 6 is a surface extended from the upper surface 61 to an upper surface of the first sub electrode 41. Therefore, the second inclined surface 622 can have a predetermined angle with the upper surface of the first sub electrode 41. An angle between the second inclined surface 622 and the upper surface of the first sub electrode 41 can be the same as that between the first inclined surface 621 and the upper surface of the third sub electrode 43.

Referring to FIGS. 2 to 4, the organic light emitting layer 7 is arranged on the first electrode 4. The organic light emitting layer 7 according to one example can be provided as at least one of a first organic light emitting layer 71 and a second organic light emitting layer 72. The second organic light emitting layer 72 can be provided to cover the first organic light emitting layer 71 at the top of the first organic light emitting layer 71. In the present disclosure, the first subpixel 21 can be provided with a two-stack structure deposited with the first organic light emitting layer 71 and the second organic light emitting layer 72, and the second subpixel 22 and the third subpixel 23 can be provided with one-stack structure of the second organic light emitting layer 72. In this case, the second organic light emitting layer 72 on the first sub electrode 41 and the second organic light emitting layer 72 on the second sub electrode 42 can be provided to be connected with each other. Also, the second organic light emitting layer 72 on the third sub electrode 43 can be provided to be connected to the second organic light emitting layer 72 on the first sub electrode 41 and the second organic light emitting layer 72 on the second sub electrode 42. In other words, the second organic light emitting layer 72 can be arranged as a common layer entirely formed on the first subpixel 21, the second subpixel 22 and the third subpixel 23.

The display device 1 according to one embodiment of the present disclosure not only can increase easiness of manufacture but also can increase a yield as the number of manufacturing processes can be reduced by forming the second organic light emitting layer 72 as a common layer, compared with the case that the second organic light emitting layer is formed to be patterned per subpixel.

The first organic light emitting layer 71 can be provided to emit blue (B) light, and more specifically, can include a hole transporting layer HTL, a blue light emitting layer EML (B), and an electron transporting layer ETL. The first organic light emitting layer 71 can further include a hole injecting layer HIL and an electron injecting layer EIL. One-stack structure can be formed using only the first organic light emitting layer 71.

The second organic light emitting layer 72 can be provided to emit yellow-green (YG) light and more specifically, can include a hole transporting layer HTL, a yellow-green light emitting layer EML (YG), and an electron transporting layer ETL. The second organic light emitting layer 72 can further include a hole injecting layer HIL and an electron injecting layer EIL. One-stack structure can be formed using only the second organic light emitting layer 72.

The hole injecting layer HIL, the hole transporting layer HTL, the electron transporting layer ETL, and the electron injecting layer EIL of the organic light emitting layer 7 are intended to improve emission efficiency of the light emitting layer EML. The hole transporting layer HTL and the electron transporting layer ETL are intended to balance between an electron and a hole, and the hole injecting layer HIL and the electron injecting layer EIL are intended to enhance injection of an electron and a hole.

If a high potential voltage is applied to the first electrode 4 and a low potential voltage is applied to the second electrode 10, holes and electrons are transferred to the light emitting layer through the hole transporting layer and the electron transporting layer, respectively and combined with each other in the light emitting layer to emit light.

The second electrode 10 can be arranged on the top of the organic light emitting layer 7, that is, on the top of the second organic light emitting layer 72 to cover the second organic light emitting layer 72.

Referring to FIGS. 2 and 3, the auxiliary electrode 8 can be provided on the first subpixel 21. In more detail, the auxiliary electrode 8 can be arranged between the first organic light emitting layer 71 on the first sub electrode 41 and the second light emitting layer 72 on the first sub electrode 41.

The auxiliary electrode 8 can be arranged on the top of the first organic light emitting layer 71, and can form an electric field with the first sub electrode 41, whereby the first organic light emitting layer 71 can emit light. That is, the auxiliary electrode 8 can serve to perform the same function as that of the second electrode which is a cathode in view of the first organic light emitting layer 71. For example, the auxiliary electrode 8 can be connected to the second electrode 10 as the display device 1 according to one embodiment of the present disclosure is connected to a voltage supply portion 14.

The voltage supply portion 14 is intended to supply a voltage to the second electrode 10, and can be arranged at an edge of the substrate 2 or on a pad portion connected to the substrate 2 at a position spaced apart from the substrate 2 at a predetermined distance. That is, the voltage supply portion 14 can be arranged on a non-display area that includes a non-light emitting area where light is not emitted.

One side of the auxiliary electrode 8 can be connected to the voltage supply portion 14 as shown in a part F of FIGS. 5a to 5c. In more detail, D denotes the first organic light emitting layer 71, the auxiliary electrode 8, and the first passivation layer 9, and E denotes the second organic light emitting layer 72. The second light emitting layer 72 is formed over the first subpixel 21, the second subpixel 22 and the third subpixel 23, and can be arranged on the first subpixel 21 to overlap the first organic light emitting layer 71. Therefore, a deposited structure of the first organic light emitting layer 71 and the second organic light emitting layer 72 can be formed on the first subpixel 21.

One side of the second electrode 10 can be connected to the voltage supply portion 14 while covering all of the first subpixel 21, the second subpixel 22 and the third subpixel 23. Therefore, a voltage for forming an electric field can be applied from the voltage supply portion 14 to the auxiliary electrode 8 and the second electrode 10.

Referring to FIG. 5a, the first organic light emitting layer 71, the auxiliary electrode 8 and the first passivation layer 9 of the first subpixel 21, which emits blue (B) light, can be connected with another subpixel, for example, a fourth subpixel 24 in a second direction (Y-axis direction) and then arranged in one stripe pattern. Therefore, the auxiliary electrode 8 provided only in the first subpixel 21 can be arranged to correspond to a plurality of subpixels in a second direction (Y-axis direction). As a result, the display device 1 according to one embodiment of the present disclosure can be provided to reduce the number of manufacturing processes as compared with the case that the auxiliary electrodes 8 provided in a subpixel for emitting blue (B) light are formed to be spaced apart from each other in a second direction (Y-axis direction). Also, the display device 1 according to one embodiment of the present disclosure can be provided to supply a voltage to the auxiliary electrodes 8 more easily than the case that the auxiliary electrodes are spaced apart from each other for each subpixel, by arranging the auxiliary electrodes 8 in a stripe pattern of one row in a second direction (Y-axis direction).

Meanwhile, each of the second subpixel 22 emitting green (G) light and the third subpixel 23 emitting red (R) light, which are arranged at both sides of the first subpixel 21, can be arranged to be spaced apart from other subpixels 25 and 26 arranged in a second direction (Y-axis direction). This is because that it is not required to connect the second subpixel 22 with the third subpixel 23 as the second subpixel 22 and the third subpixel 23 are not provided with the auxiliary electrode 8 and only the second electrode 10 is arranged on the second and third subpixels 22, 23.

One side end of the auxiliary electrode 8 and the first passivation layer 9, which are arranged on the first subpixel 21, can be connected to the voltage supply portion 14 by using at least one of a contact method using a laser welding, a contact method using a partition structure, and a contact method using an under-cut structure. In more detail, FIG. 5b illustrates that the auxiliary electrode 8 and the first passivation layer 9 are in contact with the voltage supply portion 14 by using a partition structure, and FIG. 5c illustrates that the auxiliary electrode 8 and the first passivation layer 9 are in contact with the voltage supply portion 14 by using an under-cut structure. FIGS. 5b and 5c are brief sectional views of II-II in FIG. 5a.

In FIG. 5b, H denotes a bank, and Q denotes a partition. As shown in FIG. 5b, the auxiliary electrode 8 and the first passivation layer 9, which are arranged on the first subpixel 21, can cover the bank H and the partition Q, which are formed on a contact area (part F shown in FIG. 5a) of the voltage supply portion 14. However, the first organic light emitting layer 71 has a disconnected structure without being connected with the voltage supply portion 14 due to a small gap between the bank H and the partition Q. As shown in FIG. 5b, the first organic light emitting layer 71 can partially cover a side and an upper surface of the bank H, an upper surface of the partition Q and an upper surface of the voltage supply portion 14. On the other hand, since the auxiliary electrode 8 includes a metal material, the auxiliary electrode 8 can cover not only the side and the upper surface of the bank H but also the upper surface of the voltage supply portion 14, which is exposed between the bank H and the partition Q, and a side and an upper surface of the partition Q. Therefore, as shown in FIG. 5b, the auxiliary electrode 8 can be connected to the voltage supply portion 14 through a structure of the partition Q. Since the first passivation layer 9 is arranged on the upper surface of the auxiliary electrode 8 that covers both the bank H and the partition Q, the first passivation layer 9 can be provided to cover both the bank H and the partition Q in the same manner as the auxiliary electrode 8. Meanwhile, as shown in FIG. 5b, the second organic light emitting layer 72 of the first subpixel 21 can partially cover the bank H, and the second electrode 10 can cover the second organic light emitting layer 72. At this time, the second electrode 10 can be in contact with the upper surface of the first passivation layer 9 such that an end of the second organic light emitting layer 72 may not be exposed. The second electrode 10, as shown in FIG. 5a, can directly be in contact with the voltage supply portion 14 while covering the second organic light emitting layer 72 of the first subpixel 21. The voltage supply portion 14 can be arranged to be in contact with the upper surface of the circuit element layer 3 as shown in FIG. 5b, or can be arranged in the circuit element layer 3 as shown in FIG. 5c. If the voltage supply portion 14 is arranged as shown in FIG. 5b, the voltage supply portion 14 can be another first electrode or source/drain electrode, which can supply a voltage to the auxiliary electrode 8 and the second electrode 10.

Meanwhile, in FIG. 5c, H denotes a bank, and UC denotes an under-cut structure in which the circuit element layer 3 is partially removed. In this case, the voltage supply portion 14 can be arranged in the circuit element layer 3. If the voltage supply portion 14 is arranged as shown in FIG. 5c, since the voltage supply portion 14 is arranged in the circuit element layer 3, the voltage supply portion 14 cannot be the first electrode and can be source/drain electrode unlike FIG. 5b.

As shown in FIG. 5c, the auxiliary electrode 8 and the first passivation layer 9, which are arranged on the first subpixel 21, can partially cover the upper surface of the voltage supply portion 14 arranged in the circuit element layer while covering the bank H formed in a contact area (part F shown in FIG. 5a) of the voltage supply portion 14. At this time, the auxiliary electrode 8 has a disconnected structure as shown in FIG. 5c due to the under-cut UC structure. Therefore, the auxiliary electrode 8 can be arranged at both sides based on the under-cut UC. The auxiliary electrode 8 can cover the first organic light emitting layer 71 that covers the upper surface of the circuit element layer 3 arranged at an upper side of the under-cut UC. Since the first passivation layer 9 is arranged on the auxiliary electrode 8, the first passivation layer 9 can be extended without being disconnected unlike the auxiliary electrode 8, thereby covering the auxiliary electrode 8 arranged at the upper side of the under-cut UC while covering the under-cut UC.

Meanwhile, as shown in FIG. 5c, the second organic light emitting layer 72 of the first subpixel 21 can partially cover the bank H, and the second electrode 10 can be in contact with the upper surface of the first passivation layer 9 such that an end of the second organic light emitting layer 72 may not be exposed. Therefore, the second electrode 10, as shown in FIG. 5a, can directly be in contact with the voltage supply portion 14 while covering the second organic light emitting layer 72 of the first subpixel 21.

One end of the auxiliary electrode 8 can be connected to the voltage supply portion 14 while covering the upper surface and the side of the first organic light emitting layer 71. Therefore, as shown in FIGS. 5b and 5c, the auxiliary electrode 8 can be supplied with the voltage from the voltage supply portion 14.

Meanwhile, the second electrode 10 can be connected to the voltage supply portion 14 using an open mask. In this case, the second electrode 10, as shown in FIG. 5a, can be provided over the entire surface of the first to third subpixels 21, 22 and 23. At this time, the second electrode 10 can be provided to cover one side end of the D and therefor supplied with the voltage from the voltage supply portion 14. In this way, if the second electrode 10 is arranged, the second electrode 10 can directly be in contact with the voltage supply portion 14 and therefore directly supplied with the voltage from the voltage supply portion 14. The second electrode 10 can be arranged below the part F arranged on the first subpixel 21, that is, one side end of D in a second direction (Y-axis) direction to overlap the voltage supply portion 14.

Figure 5D:
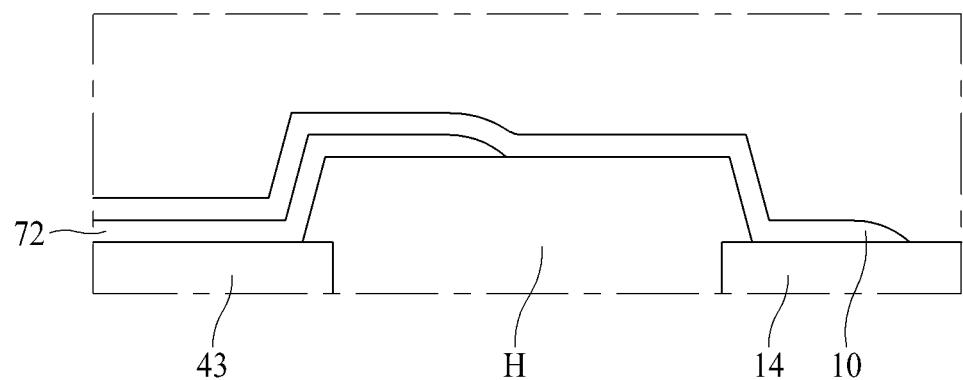

FIG. 5d is a brief cross-sectional view taken along line of FIG. 5a.

Referring to FIG. 5d, the third sub electrode 43 and the voltage supply portion 14 are spaced apart from each other, and the bank H is arranged to cover an edge of the third sub electrode 43 and an edge of the voltage supply portion 14. In this case, the second organic light emitting layer 72 arranged on the third subpixel 23 can partially cover the bank H, and the second electrode 10 can cover the second organic light emitting layer 72. At this time, the second electrode 10 can cover the upper surface of the voltage supply portion 14 while covering the other part of the bank H which is not covered by the second organic light emitting layer 72 such that the end of the second organic light emitting layer 72 may not be exposed. Therefore, as shown in FIG. 5d, the second electrode 10 arranged on the third subpixel 23 can directly be in contact with the voltage supply portion 14. The contact structure of the second electrode 10 of the third subpixel 23 and the voltage supply portion 14 as shown in FIG. 5d can equally be applied to the structure that the second electrode 10 arranged on the second subpixel 22 is in contact with the voltage supply portion 14.

Figure 5E:
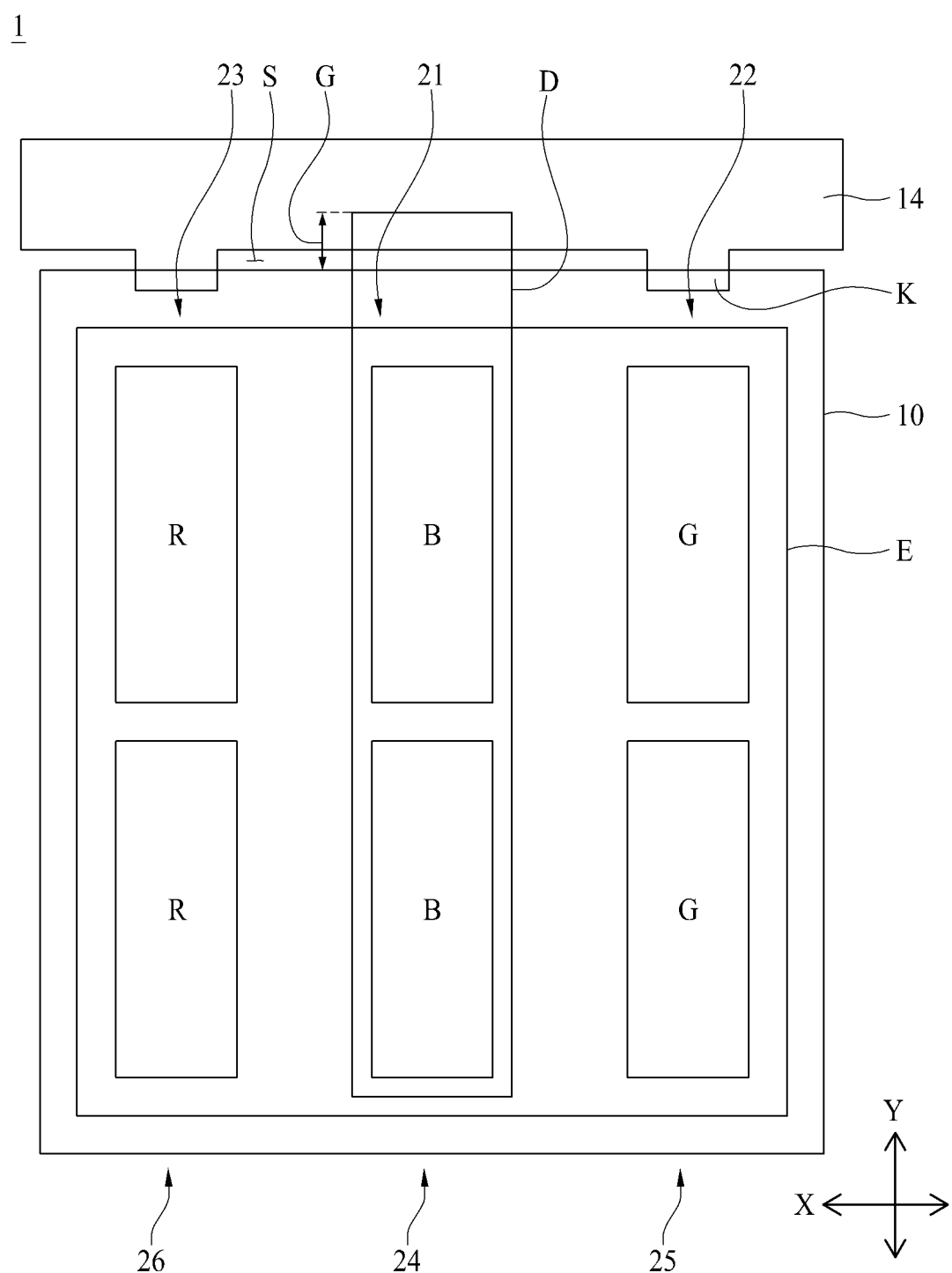
FIG. 5e is a brief view illustrating another example that an auxiliary electrode and a second electrode of a display device according to one embodiment of the present disclosure are connected to a voltage supply portion.
Figure 5F:
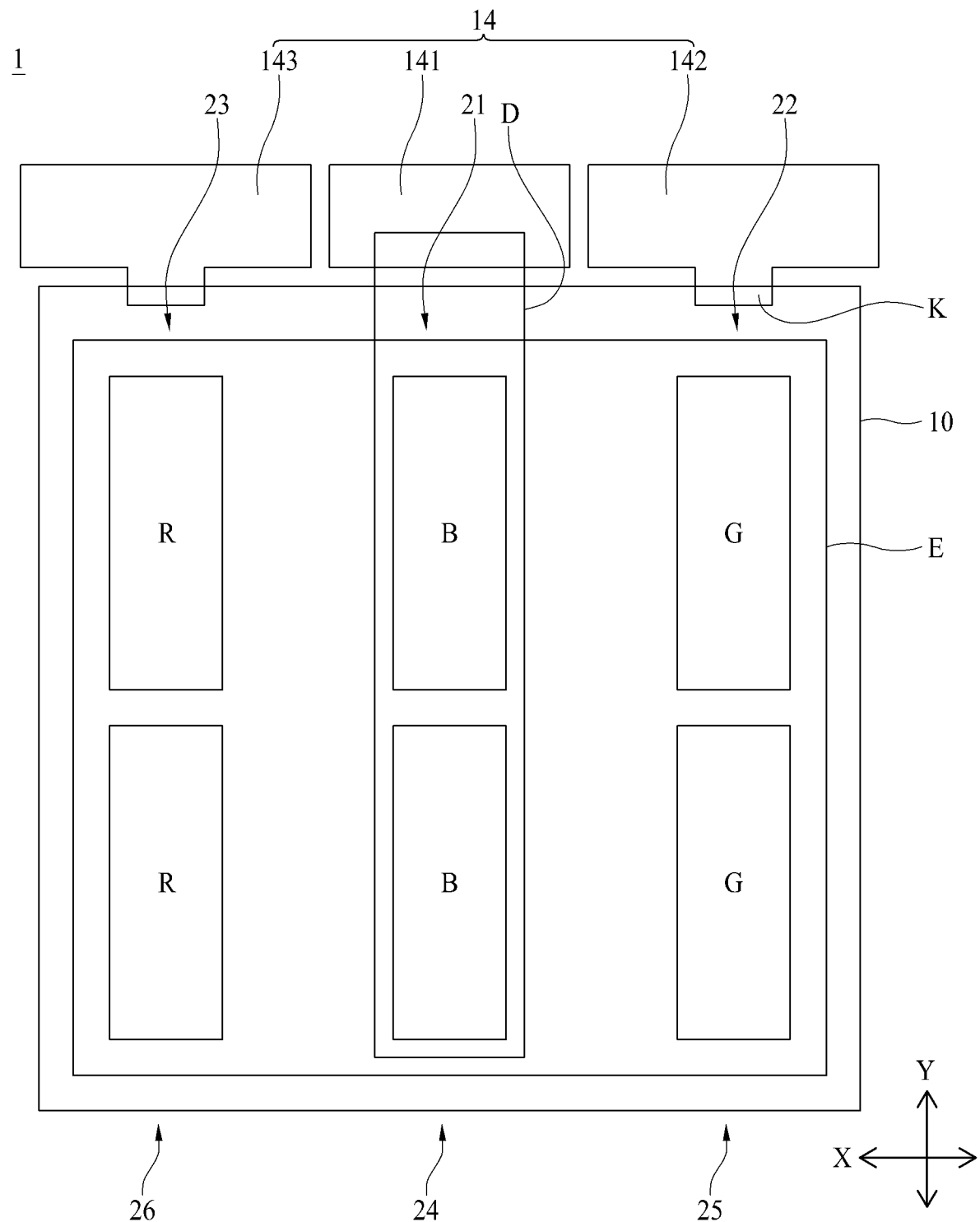
FIG. 5f is a brief view illustrating another example that an auxiliary electrode and a second electrode of a display device according to one embodiment of the present disclosure are connected to a voltage supply portion.

FIG. 5e is a brief view illustrating another example that an auxiliary electrode and a second electrode of a display device according to one embodiment of the present disclosure are connected to a voltage supply portion, and FIG. 5f is a brief view illustrating another example that an auxiliary electrode and a second electrode of a display device according to one embodiment of the present disclosure are connected to a voltage supply portion.

Referring to FIG. 5e, the structure of FIG. 5e is different from the structure of FIG. 5a in that the voltage supply portion 14 includes a plurality of protrusions K protruded toward the second subpixel 22 and the third subpixel 23. As shown in FIG. 5e, the protrusions K are not protruded toward the first subpixel 21. This is to widen a spaced interval G between one side end of D arranged on the first subpixel 21 and the second electrode 10 by allowing the second electrode 10 to be in contact with only the protrusions K. If the voltage supply portion 14 is provided as above, a contact area of the second electrode 10 and the voltage supply portion 14 can be smaller than that of the second electrode 10 and the voltage supply portion 14 shown in FIG. 5a. Also, a predetermined space S can be formed between the second electrode 10 and the voltage supply portion 14. As shown in FIG. 5e, as the contact area of the second electrode 10 and the voltage supply portion 14 becomes smaller than that of FIG. 5a and the predetermined space S is provided between the second electrode 10 and the voltage supply portion 14, the other voltage supply portion except the protrusions K of the voltage supply portion 14 can easily be folded and then arranged at the side of the display device 1 of the present disclosure, whereby a bezel width can be reduced.

Referring to FIG. 5f, the structure of FIG. 5f is different from the structure of FIG. 5e in that the voltage supply portion 14 is divided into a plurality of voltage supply portions. The voltage supply portion 14 connected with D, that is, a first voltage supply portion 141 arranged above the first subpixel 21 can supply a voltage to the subpixels arranged on the same axes in a second axial direction (Y-axis direction) through the auxiliary electrode 8. A second voltage supply portion 142 arranged above the second subpixel 22 and a third voltage supply portion 143 arranged above the third subpixel 23 can respectively be connected to the second electrode 10 through the protrusions K. Therefore, if the voltage supply portion 14, the auxiliary electrode 8 and the second electrode 10 are arranged in the structure shown in FIG. 5f, the first voltage supply portion 141 and the second voltage supply portion 142 can supply their respective voltages different from each other. Likewise, the first voltage supply portion 141 and the third voltage supply portion 143 can supply their respective voltages different from each other. On the other hand, since the second voltage supply portion 142 and the third voltage supply portion 143 are connected with each other through the second electrode 10, the second voltage supply portion 142 and the third voltage supply portion 143 cannot supply their respective voltages different from each other. However, since the second voltage supply portion 142 and the third voltage supply portion 143 are connected with each other through the second electrode 10, if any one of the second voltage supply portion 142 and the third voltage supply portion 143 is damaged, the other one can supply the voltage to the second electrode 10, whereby the second subpixel 22 and the third subpixel 23 can emit light without stopping from emitting light due to damage of the voltage supply portion.

If the first voltage supply portion 141 and the second voltage supply portion 142 supply their respective voltages different from each other as described above, luminance of blue (B) light of the first subpixel 21 and luminance of green (G) light of the second subpixel 22 can be controlled to be different from each other. Likewise, if the first voltage supply portion 141 and the third voltage supply portion 143 supply their respective voltages different from each other, luminance of blue (B) light of the first subpixel 21 and luminance of red (R) light of the third subpixel 23 can be controlled to be different from each other. Therefore, if the voltage supply portion 14, the auxiliary electrode 8 and the second electrode 10 are arranged in the structure shown in FIG. 5f, since the display device 1 according to one embodiment of the present disclosure can control luminance of blue (B) light and luminance of red (R) light to be different from each other and control luminance of blue (B) light and luminance of green (G) light to be different from each other, the display device 1 can embody a more detailed image than the case that the same voltage is supplied to the first to third subpixels 21, 22 and 23.

Also, since the voltage supply portion 14 is divided into a plurality of voltage supply portions as shown in FIG. 5f, if any one of the voltage supply portions is damaged, the display device 1 according to one embodiment of the present disclosure can be provided to prevent an image flow from being disconnected by easily exchanging only the damaged voltage supply portion with new one without stopping whole images which are output.

In the display device 1 according to one embodiment of the present disclosure, since the auxiliary electrode 8 and the second electrode 10 are in contact with the voltage supply portion 14, if the voltage is supplied from the voltage supply portion 14, the same voltage is supplied to the second electrode 10 arranged above the second organic light emitting layer 72 and the auxiliary electrode 8 arranged below the second organic light emitting layer 72, whereby an electric field is not formed between the second electrode 10 and the auxiliary electrode 8 and therefore the second organic light emitting layer 72 may not emit light. Additionally, the display device 1 according to one embodiment of the present disclosure comprises a first passivation layer 9 provided between the auxiliary electrode 8 and the second organic light emitting layer 72 to electrically insulate the auxiliary electrode 8 from the second electrode 10, whereby an electric field may not be formed toward the second organic light emitting layer 72. The first passivation layer 9 can be made of, but not limited to, SiNx or a material including SiNx, and can be made of other materials as long as they can electrically insulate the auxiliary electrode 8 from the second electrode 10.

Therefore, in the display device 1 according to one embodiment of the present disclosure, although the first subpixel 21 has a two-stack structure deposited with the first organic light emitting layer 71 and the second light emitting layer 72, the auxiliary electrode 8 is connected with the second electrode 10 to form an electric field only between the auxiliary electrode 8 and the first sub electrode 41, whereby only the first organic light emitting layer 71 can emit light. As a result, in the display device 1 according to one embodiment of the present disclosure, although the first subpixel 21 has a two-stack structure, the first organic light emitting layer 71 can be allowed to emit light by the voltage supplied to one-stack structure, whereby overall power consumption can be reduced.

Referring to FIGS. 2 to 5f again, the second electrode 10 is provided to cover the first bank 5, the second bank 6 and the second organic light emitting layer 72. The second electrode 10 according to one example is a common layer commonly formed on the first subpixel 21, the second subpixel 22 and the third subpixel 23. The second electrode 10 can be formed of a transparent conductive material (TCO) such as ITO and IZO, which can transmit light, or can be formed of a semi-transmissive conductive material such as Mg, Ag, or Alloy of Mg and Ag.

The second passivation layer 11 can be formed on the second electrode 10. The second passivation layer 11 can be provided to cover the second electrode 10. The second passivation layer 11 according to one example is to prevent particles such as water from being permeated into the second electrode 10 and the organic light emitting layer 7 arranged below the second electrode 10. The second passivation layer 11 can be made of the same material as that of the first passivation layer 9 but can be made of a material different from that of the first passivation layer 9. The encapsulation layer 12 can be arranged on the second passivation layer 11. The second passivation layer 11 can be made of the same material as that of the encapsulation layer 12.

The encapsulation layer 12 serves to prevent oxygen or water from being permeated into the organic light emitting layer 7, the second electrode 10 and the second passivation layer 11. To this end, the encapsulation layer 12 can include at least one inorganic film and at least one organic film.

For example, the encapsulation layer 12 can include a first inorganic film, an organic film, and a second inorganic film. In this case, the first inorganic film is formed to cover the second passivation layer 11. The organic film is formed to cover the first inorganic film. It is preferable that the organic film is formed at a length long enough to prevent particles from being permeated into the organic light emitting layer 7, the second electrode 10 and the second passivation layer 11 by passing through the first inorganic film. The second inorganic film can be formed to cover the organic film.

The color filter 13 can be provided on the encapsulation layer 12. The color filter 13 is to filter light emitted from the organic light emitting layer 7. The color filter 13 according to one example can be provided to shield light of the other colors such that red (R) light or green (G) light can be emitted from the yellow-green (YG) light emitting layer. The color filter 13 according to another example can be provided to shield light of the other colors such that red (R) light, blue (B) light and green (G) light can be emitted from the white light emitting layer. The color filter 13 according to other example can be provided to shield light of the other colors except blue (B) light from light emitted from the blue (B) light emitting layer to enhance a color reproduction rate.

The color filter 13, as shown in FIG. 2, can be provided to be arranged in the encapsulation layer 12. In this case, since a distance between the color filter 13 and the organic light emitting layer 7 becomes short, a problem of a color mixture between adjacent subpixels can be solved. That is, a cell gap can be reduced to avoid a color mixture.

Referring to FIGS. 1 and 2 again, the display device 1 according to one embodiment of the present disclosure can be provided such that the first subpixel 21 can emit blue (B) light and the second subpixel 22 can emit red (R) light or green (G) light. In this case, the color filter 13 can be arranged on only the second subpixel 22.

Although the first subpixel 21 has a two-stack structure deposited with the first organic light emitting layer 71 and the second light emitting layer 72, the auxiliary electrode 8 is connected with the second electrode 10 to form an electric field only between the auxiliary electrode 8 and the first sub electrode 41, whereby only the first organic light emitting layer 71 emits light. In this case, since the first organic light emitting layer 71 emits blue (B) light, the color filter 13 for emitting only blue (B) light is not needed to be arranged on the first subpixel 21. Therefore, since the color filter is not needed to be formed on the first subpixel 21, the display device 1 according to one embodiment of the present disclosure can enhance easiness of manufacture and reduce the manufacturing cost.

However, the color filter can be formed on the first subpixel 21, which is provided to emit blue (B) light, to enhance a color reproduction rate as described above.

On the other hand, as the second organic light emitting layer 72 arranged on the second subpixel 22 and the third subpixel 23 can be provided to emit yellow-green (YG) light, a color filter for emitting only red (R) light or green (G) light from each of the second subpixel 22 and the third sub-pixel 23 is necessarily required. Therefore, as shown in FIG. 2, the color filter 13 is not arranged on the first subpixel 21 for emitting blue (B) light, and the color filter 13 is arranged on the second subpixel 22 for emitting green (G) light and the third subpixel 23 for emitting red (R) light.

A first color filter 131 arranged on the second subpixel 22 and a second color filter 132 arranged on the third subpixel 23 can be provided to emit light of respective colors different from each other. For example, if the first color filter 131 shields light of the other colors to emit green (G) light, the second subpixel 22 can emit only green (G) light. If the second color filter 132 shields light of the other colors to emit red (R) light, the third subpixel 23 can emit only red (R) light. Therefore, the display device 1 according to one embodiment of the present disclosure can be provided such that the first sub pixel 21, the second subpixel 22 and the third subpixel 23 can respectively emit blue (B) light, green (G) light and red (R) light. If the first to third subpixels 21, 22 and 23 simultaneously emit light, white light can be embodied by combination of blue (B) light, green (G) light and red (R) light.

FIGS. 6a to 6h are cross-sectional views illustrating a brief manufacturing process of a display device according to one embodiment of the present disclosure. The display device 1 according to one embodiment of the present disclosure can be provided such that the auxiliary electrode 8 and the second electrode 10 on the first sub electrode 41 can be connected with each other through the following manufacturing process. In this case, the auxiliary electrode 8 and the second electrode 10 can be connected with each other through the voltage supply portion 14 arranged on the non-light emitting area.

Meanwhile, the first passivation layer 9 can be provided to electrically disconnect the auxiliary electrode 8 from the second electrode 10. In this case, the first passivation layer 9 can be arranged between the auxiliary electrode 8 and the second electrode 10 on the light emitting area of the first subpixel 21, thereby electrically disconnecting the auxiliary electrode 8 from the second electrode 10.

The organic light emitting layer 7 can be formed in such a manner that the first organic light emitting layer 71 including a light emitting layer of blue (B) light is formed and then the second organic light emitting layer 72 including a light emitting layer of yellow-green (YG) light is formed.

The second organic light emitting layers 72 arranged on the first to third subpixels 21, 22 and 23 can be provided to be connected with one another.

The first subpixel 21, the second subpixel 22 and the third subpixel 23 can be provided to respectively emit blue (B) light, green (G) light and red (R) light. However, without limitation to this case, the first subpixel 21, the second subpixel 22 and the third subpixel 23 can be provided to respectively emit blue (B) light, red (R) light and green (G) light. Hereinafter, the case that the first subpixel 21, the second subpixel 22 and the third subpixel 23 are provided to respectively emit blue (B) light, green (G) light and red (R) light will be described as an example.

Figure 6A:
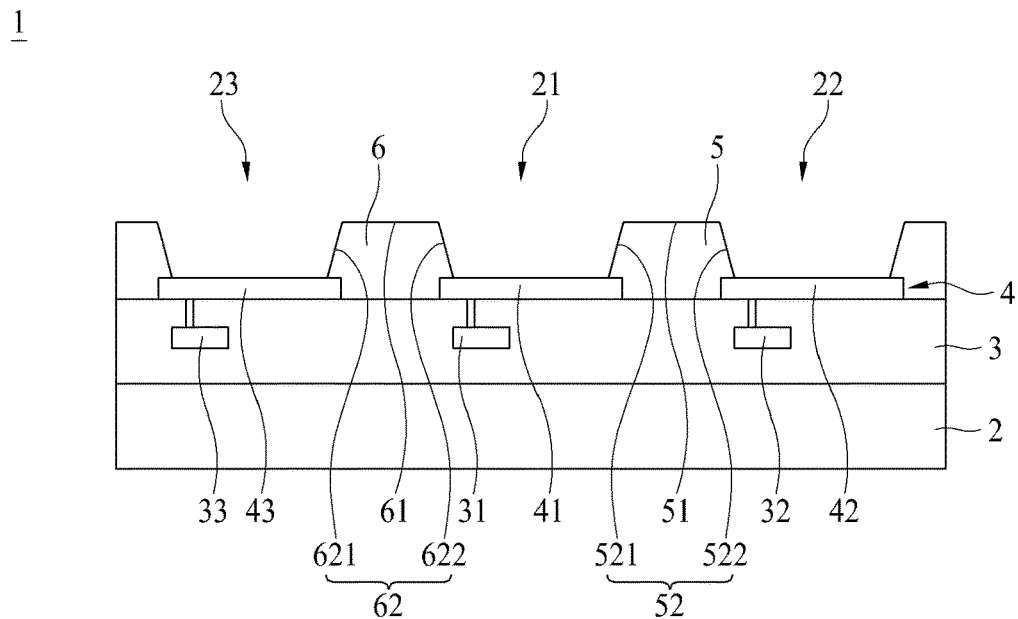
FIGS. 6a to 6h are cross-sectional views illustrating a brief manufacturing process of a display device according to one embodiment of the present disclosure.
Figure 6B:
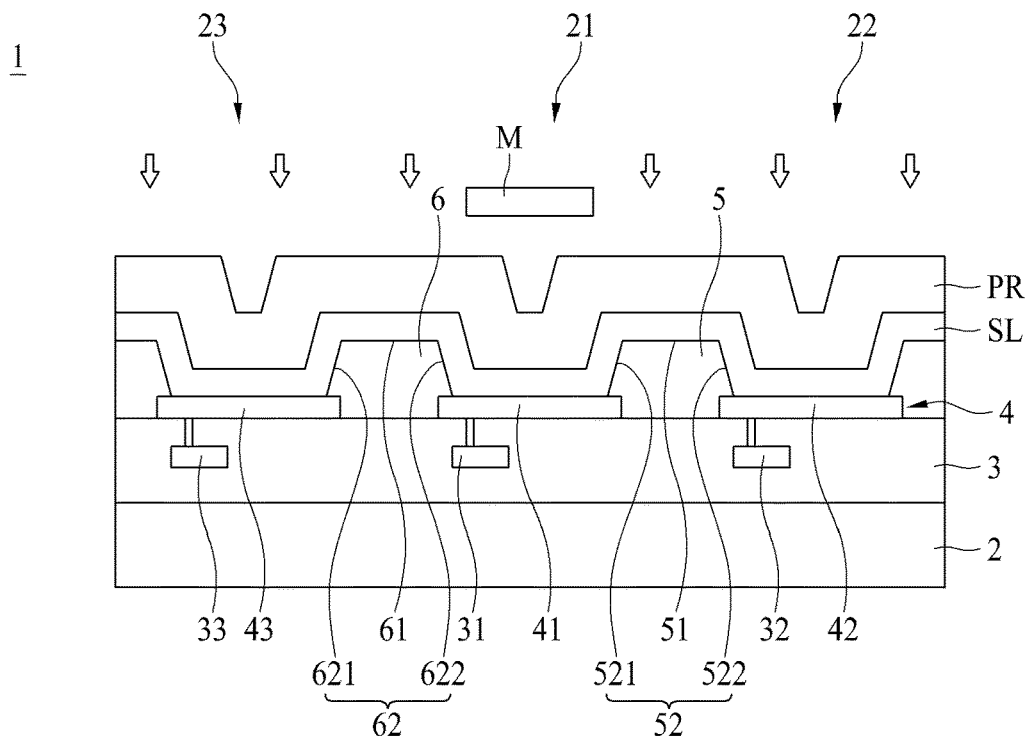

Referring to FIGS. 6a to 6b, in a state that the first electrode 4, the first bank 5 and the second bank 6 are formed on the substrate 2 and the circuit element layer 3, after a shield layer SL and a PR layer are deposited in due order, a mask M (shown in FIG. 6b) is arranged on a place where a first deposition hole H1 (shown in FIG. 6c) is to be formed, and then the other area is subjected to exposure. Therefore, property of the other area of the PR layer except the area where the first deposition hole H1 is to be formed is changed. For example, property of the other area of the PR layer can be changed not to be etched even with a developing solution. The first deposition hole H1 is a hole for forming the first organic light emitting layer 71, the auxiliary electrode 8, and the first passivation layer 9, and can eventually become an upper surface of the first sub electrode 41. The PR layer can be a photoresist layer.

Figure 6C:
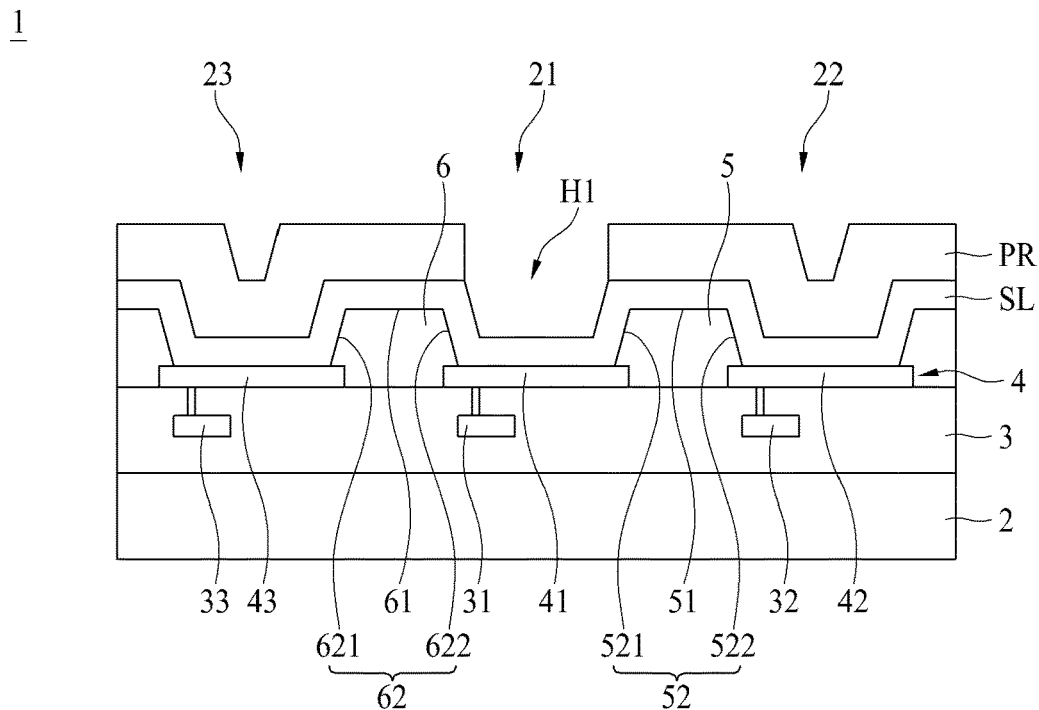
Figure 6D:
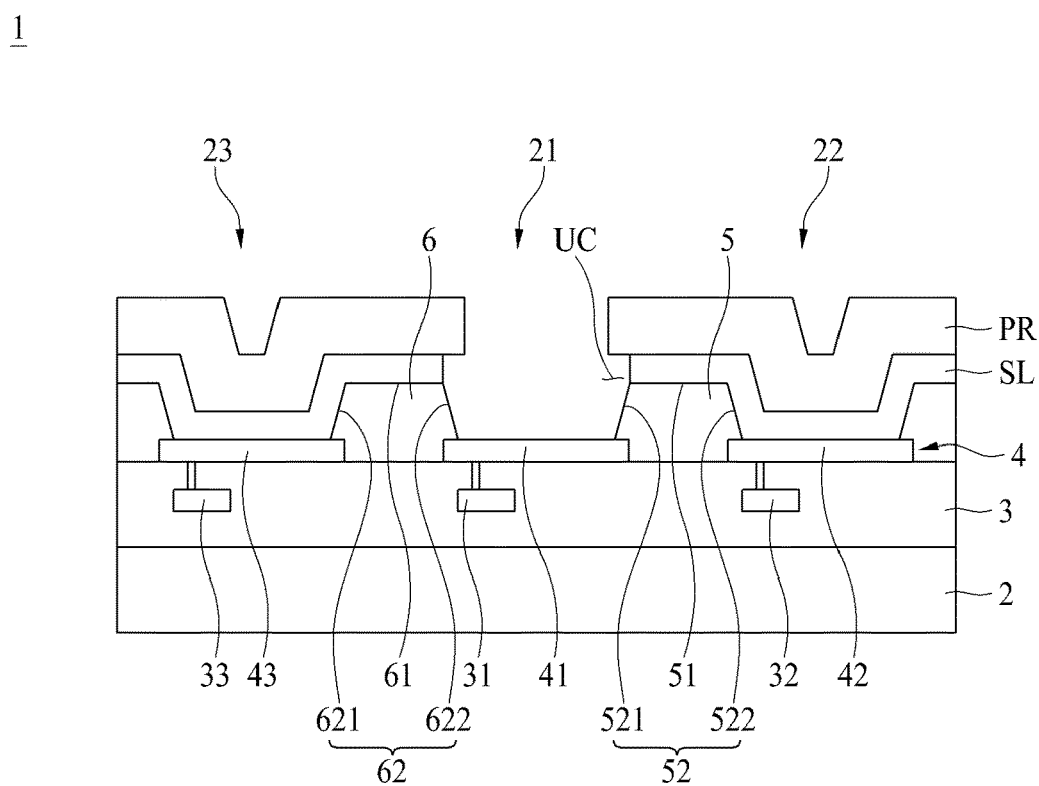

Then, referring to FIGS. 6c and 6d, a primary removing process is performed to remove a PR layer, which is arranged on the area where the first deposition hole H1 is to be formed, by using a developing solution. The PR layer removed by the developing solution can be corroded by being put in the developing solution and then removed.

Then, a secondary removing process is performed to remove a shield layer SL, which is arranged on the area where the first deposition hole H1 is to be formed, by using a developing solution. In this case, the time required to put the shield layer SL in the developing solution is increased in the secondary removing process as compared with the primary removing process to increase a volume of the shield layer SL, which is to be removed, as compared with the primary removing process, whereby so called an under-cut (UC) area can be formed. Therefore, a width of the shield layer SL removed by the secondary removing process can be wider than a width of the PR layer removed by the primary removing process.

Figure 6E:
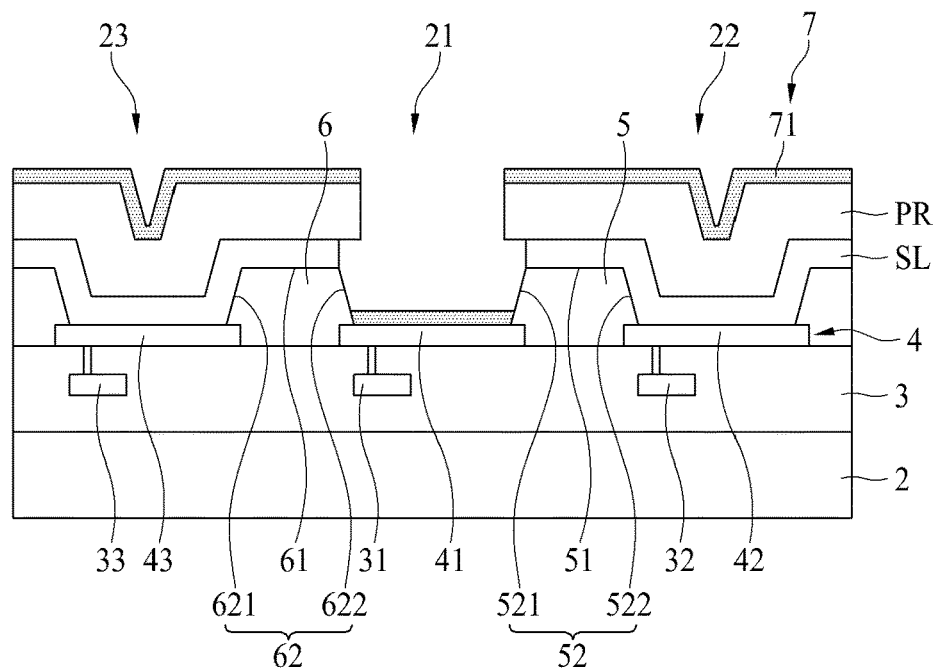

Then, referring to FIG. 6e, the first organic light emitting layer 71 is formed on the first sub electrode 41. For example, the first organic light emitting layer 71 can be formed on the first sub electrode 41 by sequentially depositing organic materials on the entire surface toward an upper surface of the first sub electrode 41 from the outside of the PR layer in various manners. The organic materials can be deposited on the upper surface of the first sub electrode 41 through the first deposition hole H1. On the other hand, organic materials can be deposited even on the PR layer due to such a process. The first organic light emitting layer 71 can be provided by sequentially depositing a hole injecting layer HIL, a hole transporting layer HTL, a blue light emitting layer EML (B), an electron transporting layer ETL, and an electron injecting layer EIL Then, referring to FIG. 6f, the auxiliary electrode 8 can be deposited on the entire surface to cover the first organic light emitting layer 71, and the first passivation layer 9 is deposited on the entire surface to cover the auxiliary electrode 8.

Figure 6F:
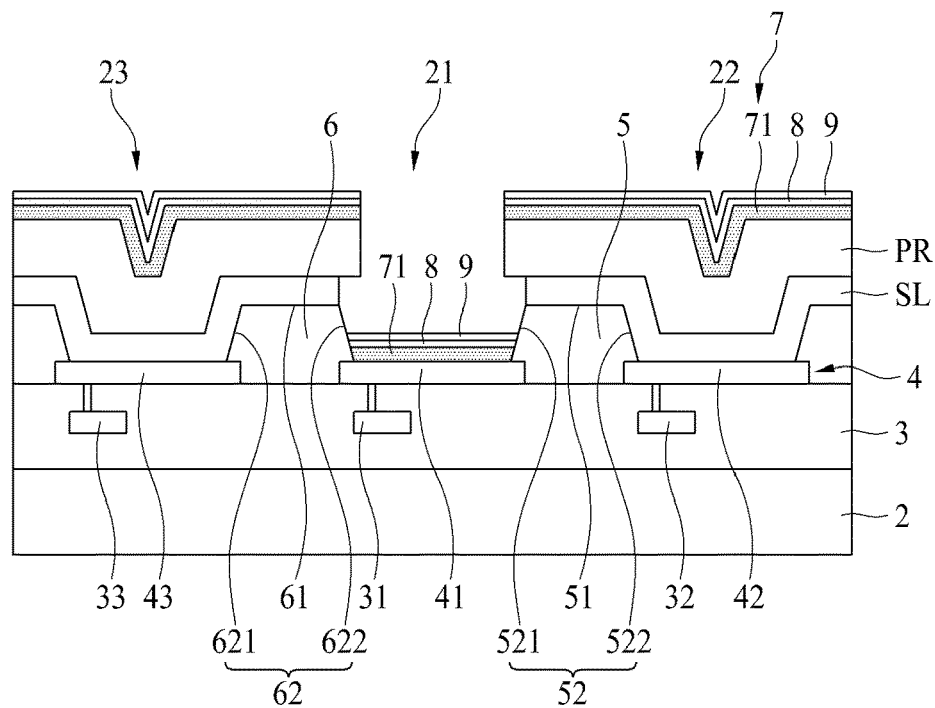

Although FIG. 6f shows that the auxiliary electrode 8 covers only the upper surface of the first organic light emitting layer 71, the auxiliary electrode 8 can be provided to cover the upper surface and the side of the first organic light emitting layer 71.

At this time, one side of the auxiliary electrode 8 can be connected to the voltage supply portion 14 provided in the non-light emitting area by using at least one of a contact method using a laser welding, a contact method using a partition structure, and a contact method using an under-cut structure. Therefore, once the second electrode 10 is connected to the voltage supply portion 14 in a follow-up process, the auxiliary electrode 8 can be connected to the second electrode 10 on non-light emitting layer through the voltage supply portion 14. Therefore, since the auxiliary electrode 8 can function as a cathode, that is, the second electrode on the first subpixel 21, only the first organic light emitting layer 71 can emit light.

Then, the first passivation layer 9 is deposited on the entire surface to cover the auxiliary electrode 8. The first passivation layer 9 can be provided to cover the upper surface of the auxiliary electrode 8 or the upper surface and the side of the auxiliary electrode 8 in the same manner the aforementioned auxiliary electrode 8. The first passivation layer 9 can be formed of SiNx based material to electrically insulate the auxiliary electrode 8 from the second electrode 10.

Figure 6G:
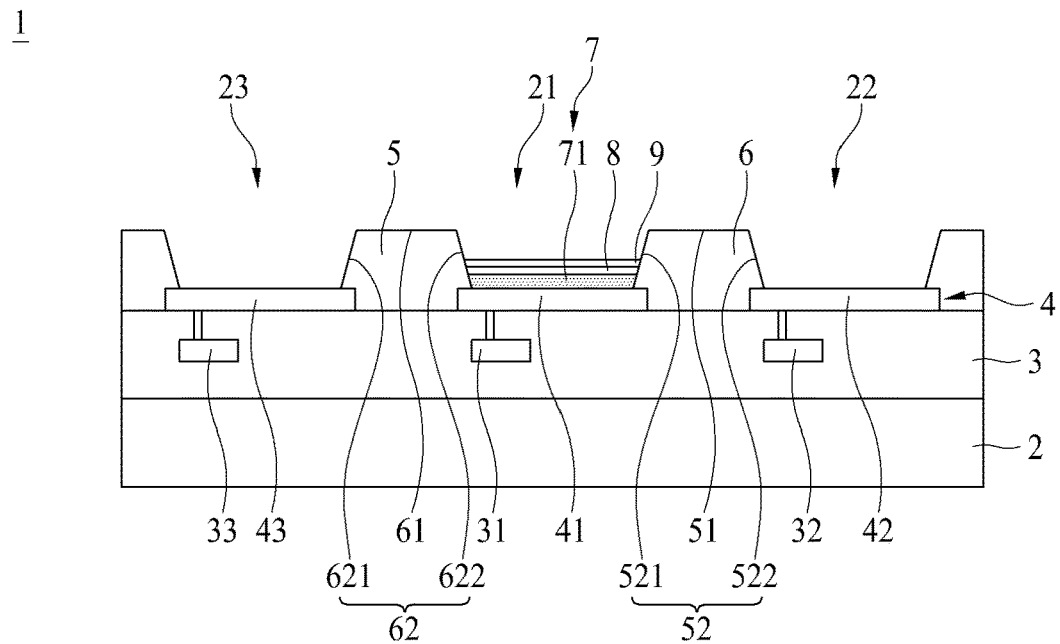

Then, referring to FIG. 6g, a third removing process is performed to remove the other elements except the first organic light emitting layer 71, the auxiliary electrode 8 and the first passivation layer 9. The third removing process can be performed in such a manner that the shield layer SL deposited on the banks including the first bank 5 and the second bank 6 and the second sub electrode 42 and the third sub electrode 43 except the first organic light emitting layer 71, the auxiliary electrode 8 and the first passivation layer 9, which are formed on the first sub electrode 41, is lifted-off through a strip process. Therefore, the first organic light emitting layer 71 of which upper surface is protected by the auxiliary electrode 8 and the auxiliary electrode 8 of which upper surface is protected by the first passivation layer 9 can be formed on the upper surface of the first sub electrode 41.

In this case, the first passivation layer 9 can additionally serve to prevent the auxiliary electrode 8 and the first organic light emitting layer 71 arranged below the auxiliary electrode 8 from being damaged by a strip solution used during the lift-off process by preventing the strip solution from being in contact with the auxiliary electrode 8.

Figure 6H:
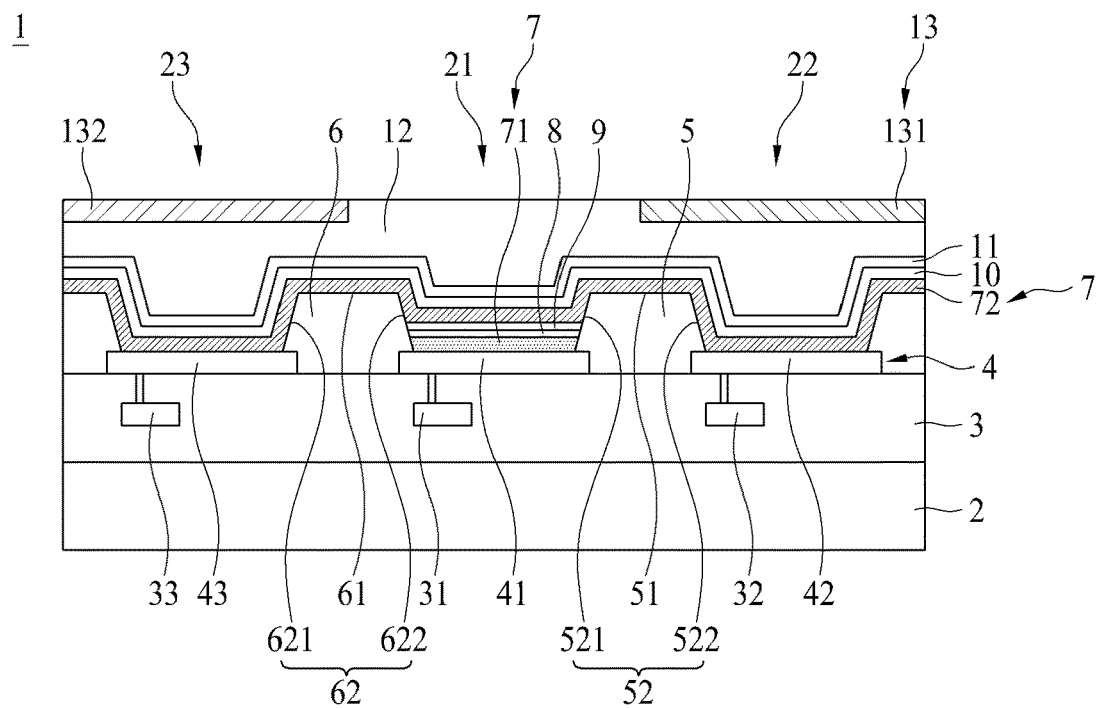

Then, referring to FIG. 6h, the second organic light emitting layer 72, the second electrode 10, the second passivation layer 11 and the encapsulation layer 12 are sequentially deposited on the entire surface to cover the first passivation layer 9, the first bank 5, the second bank 6, the second sub electrode 42 and the third sub electrode 43. In this case, one side of the second electrode 10 can be connected to the voltage supply portion 14 while covering all of the first to third subpixels 21, 22 and 23. Therefore, a voltage for forming an electric field can be applied from the voltage supply portion 14 to the auxiliary electrode 8 and the second electrode 10 at the same time. As the second electrode 10, the second passivation layer 11 and the encapsulation layer 12 are provided to be deposited on the entire surface, the display device 1 according to one embodiment of the present disclosure can be manufactured more easily than the case that the second electrode, the second passivation layer and the encapsulation layer are formed to be patterned, whereby the manufacturing time can be reduced.

Then, the color filter 13 is formed on the encapsulation layer 12. The color filter 13 according to one example can be formed on the second subpixel 22 and the third subpixel 23 except the first subpixel 21 provided to emit blue (B) light. The second subpixel 22 and the third subpixel 23 can be provided to respectively emit green (G) light and red (R) light. However, without limitation to this case, the second subpixel 22 and the third subpixel 23 can be provided to respectively emit red (R) light and green (G) light. If the second subpixel 22 and the third subpixel 23 are provided to respectively emit green (G) light and red (R) light, the first color filter 131 arranged on the second subpixel 22 can be provided as a green color filter to shield light of the other colors except light of green (G) color, and the second color filter 132 arranged on the third subpixel 23 can be provided as a red color filter to shield light of the other colors except light of red (R) color. In this case, since the organic light emitting layer 7 of the first subpixel 21 is provided to emit only blue (B) light, the organic light emitting layer 7 does not need the color filter but can be provided with a blue color filter for shielding light of the other colors except blue (B) color to enhance a color reproduction rate of blue (B) light. Meanwhile, although the color filter 13 is shown to be arranged in the encapsulation layer 12 in FIG. 6h, the color filter 13 can be arranged above the encapsulation layer 12.

Figure 7:
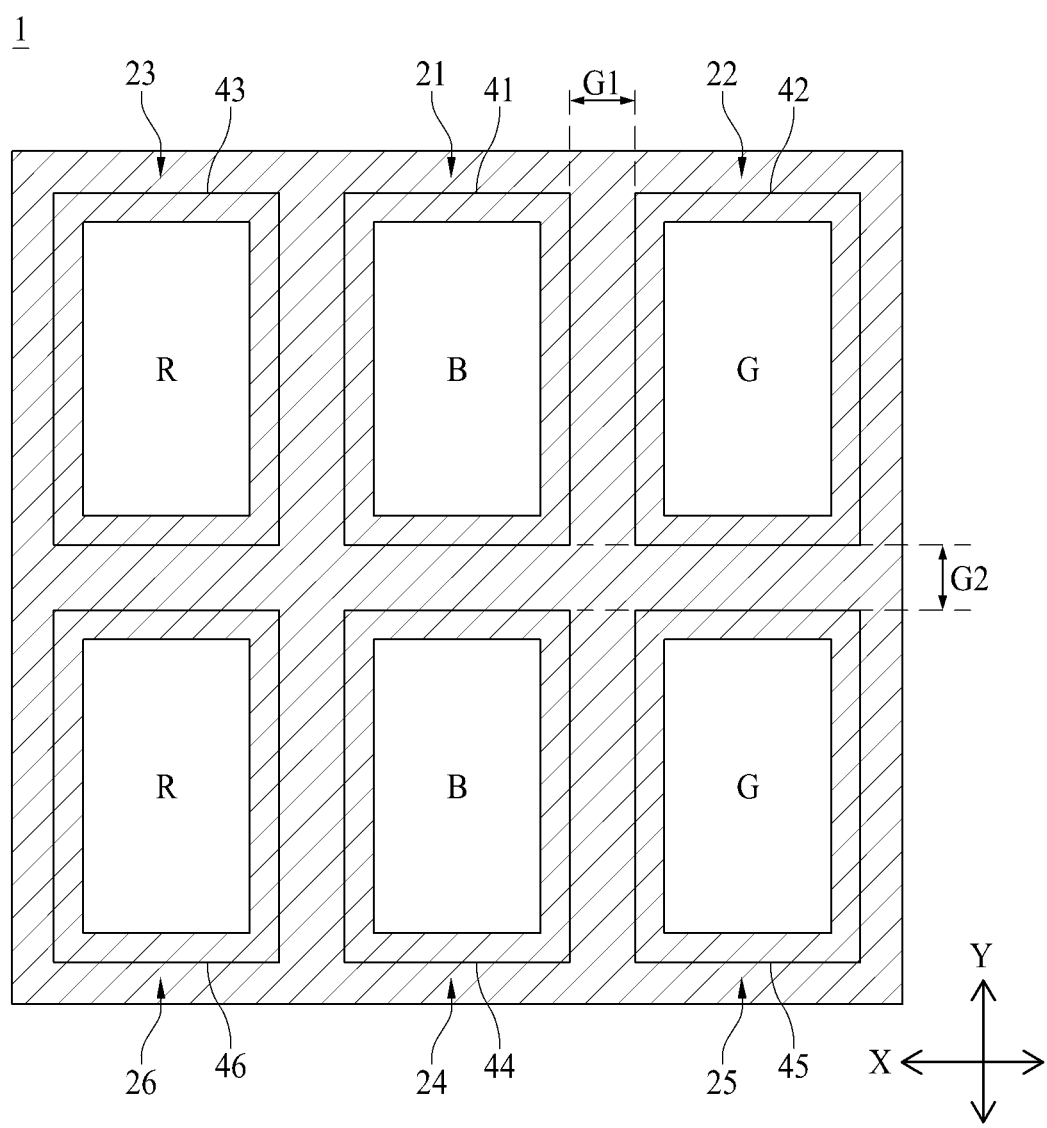
FIG. 7 is a brief plane view illustrating a display device according to another embodiment of the present disclosure.

FIG. 7 is a brief plane view illustrating a display device according to another embodiment of the present disclosure.

Referring to FIG. 7, the display device 1 according to another embodiment of the present disclosure can comprise a substrate 2, a circuit element layer 3, a first electrode 4, a first bank 5, a second bank 6, an organic light emitting layer 7, an auxiliary electrode 8, a first passivation layer 9, a second electrode 10, a second passivation layer 11, an encapsulation layer 12, and a color filter 13. The display device 1 according to another embodiment of the present disclosure is the same as the display device 1 according to one embodiment of the present disclosure except that a fourth subpixel 24, a fifth subpixel 25, a sixth subpixel 26, a fourth sub electrode 44, a fifth sub electrode 45 and a sixth sub electrode 46 are additionally provided, wherein the fourth sub electrode 44, the fifth sub electrode 45 and the sixth sub electrode 46 are respectively included in the fourth subpixel 24, the fifth subpixel 25 and the sixth subpixel 26. Therefore, description of the display device 1 according to another embodiment of the present disclosure will be replaced with the aforementioned description.

Referring to FIG. 7, the display device 1 according to another embodiment of the present disclosure is the same as the display device 1 according to one embodiment of the present disclosure in that the first subpixel 21, the second subpixel 22 and the third subpixel 23 are arranged in a first direction (X-axis direction) and provided to respectively emit blue (B) light, green (G) light and red (R) light. However, the display device 1 according to another embodiment of the present disclosure is different from the display device 1 according to one embodiment of the present disclosure in that the fourth subpixel 24, the fifth subpixel 25 and the sixth subpixel 26 are arranged with the same color in a second direction (Y-axis direction).

For example, in the display device 1 according to another embodiment of the present disclosure, if the first subpixel 21, the second subpixel 22 and the third subpixel 23 are provided to respectively emit blue (B) light, green (G) light and red (R) light, the fourth subpixel 24, the fifth subpixel 25 and the sixth subpixel 26 can be provided to respectively emit blue (B) light, green (G) light and red (R) light.

Based on FIG. 7, the first direction means a horizontal direction and the second direction means a vertical direction. The first direction can mean a horizontal direction of the display device 1 according to the present disclosure, and the second direction can mean a vertical direction of the display device 1 according to the present disclosure. Referring to FIG. 2, the third subpixel 23 for emitting red (R) light, the first subpixel 21 for emitting blue (B) light and the second subpixel 22 for emitting green (G) light are sequentially arranged in the first direction, and the second organic light emitting layer 72 which includes a light emitting layer for emitting yellow-green (YG) light can be provided in the third subpixel 23 and the second subpixel 22, and the first organic light emitting layer 71 which includes a light emitting layer for emitting blue (B) light can be provided only in the first subpixel 21. Therefore, the first sub-pixel 21 has a two-stack structure sequentially deposited with the first organic light emitting layer 71 and the second organic light emitting layer 72, and the second subpixel 22 and the third subpixel 23 have a one-stack structure deposited with only the second organic light emitting layer 72.

Although the first subpixel 21 has a two-stack structure, the auxiliary electrode 8 is connected with the second electrode 10, whereby the organic light emitting layer 7 of the first subpixel 21 of a two-stack structure can emit light by the driving voltage for emitting the light emitting layer of one-stack structure as described in the display device 1 according to one embodiment of the present disclosure.

Meanwhile, referring to FIGS. 2 and 7, in one embodiment and another embodiment of the present disclosure, as the first subpixel 21 for emitting blue (B) light can be arranged between the second subpixel 22 and the third subpixel 23 based on the first direction, the second subpixel 22 and the third subpixel 23, which are provided with only the second organic light emitting layer 72 for emitting yellow-green (YG) light, can be spaced apart from each other to make a long current path. Therefore, in the display device 1 according to one embodiment and another embodiment of the present disclosure, since occurrence of a leakage current between the second subpixel 22 and the third subpixel 23 can be reduced, a color mixture between red (R) light and green (G) light can be prevented from occurring.

Referring to FIG. 7, the display device 1 according to another embodiment of the present disclosure can be provided such that the first sub electrode 41 of the first subpixel 21 and the second sub electrode 42 of the second subpixel 22 can be spaced apart from each other at a first interval G1 and the first sub electrode 41 can be spaced apart from the fourth sub electrode 44 arranged in the second direction at a second interval G2. An interval between the second sub electrode 42 and the fifth sub electrode 45 can also be provided as the second interval G2, and an interval between the third sub electrode 43 and the sixth sub electrode 46 can also be provided as the second interval G2.

In this case, the second interval G2 can be equal to or smaller than the first interval G1. In more detail, the first interval G1 can be an interval between subpixels for emitting light of different colors, and the second interval G2 can be an interval between subpixels for emitting light of the same color. Referring to FIG. 7, since the subpixels arranged at the second interval G2 emit light of the same color, a color mixture does not occur even though a leakage current occurs. On the other hand, since the subpixels arranged at the first interval G1 emit light of different colors, a problem occurs in that a color mixture occurs if the spaced distance, that is, the interval is narrow. Therefore, in the display device 1 according to another embodiment of the present disclosure, as the subpixels for emitting light of the same color are arranged at the second interval G2 narrower than the first interval G1, the number of the subpixels arranged on the light emitting area in the second direction can be increased without occurrence of a color mixture, the display device of ultra-high resolution can be embodied.

Figure 8A:
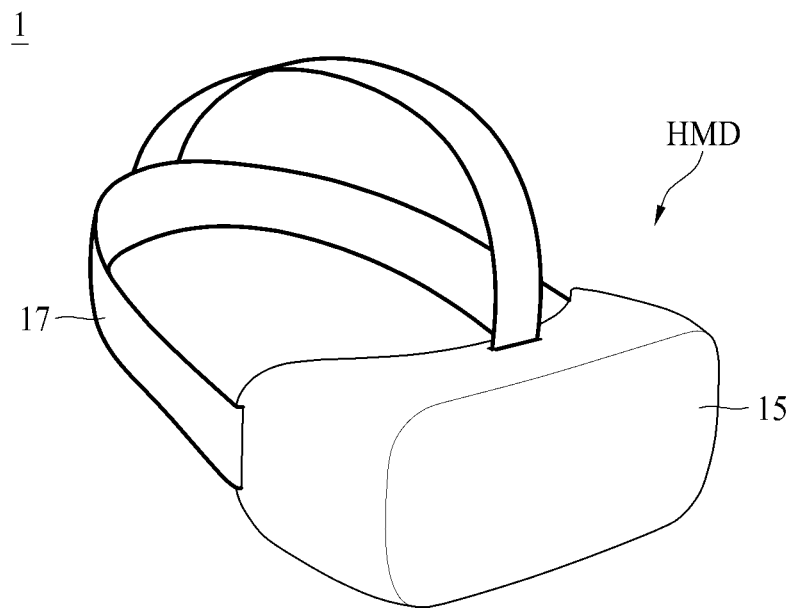
FIGS. 8a to 8c are views illustrating a display device according to another embodiment of the present disclosure, and relate to a head-mounted display (HMD) device.
Figure 8B:
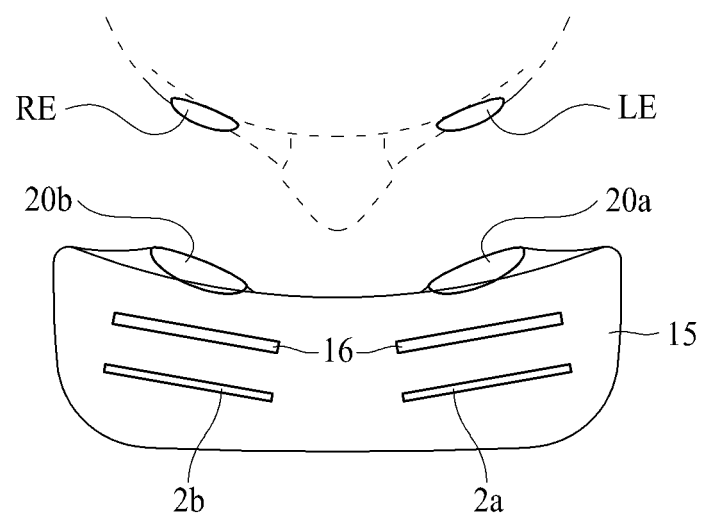
Figure 8C:
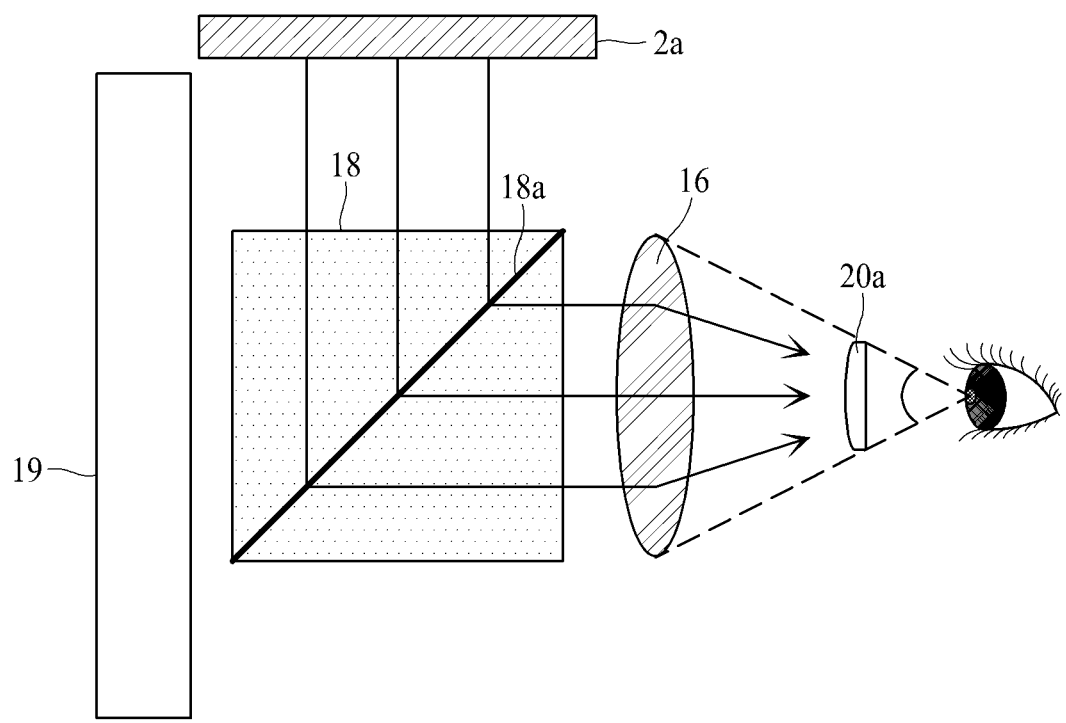

FIGS. 8a to 8c are views illustrating a display device according to another embodiment of the present disclosure, and relate to a head-mounted display (HMD) device. FIG. 8a is brief perspective view, FIG. 8b is a brief plane view of a virtual reality (VR) structure, and FIG. 8c is a brief cross-sectional view of an augmented reality (AR) structure.

Referring to FIG. 8a, a head mounted display device according to present disclosure comprises a storage case 15 and a head mounted band 17.

The storage case 15 stores elements such as a display device, a lens array, and an ocular lens.

The head mounted band 17 is fixed to the storage case 15. The head mounted band 17 is formed to surround a top surface and both sides of a user's head, but is not limited to this example. The head mounted band 17 is to fix a head mounted display to a user's head and can be replaced with a structure of a shape of a glasses frame or a helmet shape.

Referring to FIG. 8b, the head mounted display device 1 of a virtual reality (VR) structure according to the present disclosure can include a left eye display device 2a, a right eye display device 2b, a lens array 16, a left eye ocular lens 20a, and a right eye ocular lens 20b.

The left eye display device 2a, the right eye display device 2b, the lens array 16, the left eye ocular lens 20a and the right eye ocular lens 20b are stored in the storage case 15 described above.

The left eye display device 2a and the right eye display device 2b can display the same image, and in this case, a user can view 2D image. Alternatively, the left eye display device 2a can display a left eye image and the right eye display device 2b can display a right eye image, and in this case, a user can view a 3D image. Each of the left eye display device 2a and the right eye display device 2b can be comprised of a display device according to FIGS. 1 to 7 described above. For example, each of the left eye display device 2a and the right eye display device 2b can be an organic light emitting display device.

Each of the left eye display device 2a and the right eye display device 2b can include a plurality of subpixels, a circuit element layer 3, a first electrode 4, a first bank 5, a second bank 6, an organic light emitting layer 7, an auxiliary electrode 8, a first passivation layer 9, a second electrode 10, a second passivation layer 11, an encapsulation layer 12, a color filter 13 and a voltage supply portion 14, and can display various images by combining colors of light emitted from each of the subpixels in various manners.

The lens array 16 can be provided between the left eye ocular lens 20a and the left eye display device 2a by being spaced apart from each of the left eye ocular lens 20a and the left eye display device 2a. That is, the lens array 16 can be arranged in front of the left eye ocular lens 20a and behind the left eye display device 2a. Also, the lens array 16 can be provided between the right eye ocular lens 20b and the right eye display device 2b by being spaced apparat from each of the right eye ocular lens 20b and the right eye display device 2b. That is, the lens array 16 can be arranged in front of the right eye ocular lens 20b and behind the right eye display device 2b.

The lens array 16 can be a micro lens array. The lens array 16 can be replaced with a pin hole array. Due to the lens array 16, images displayed on a left eye display device 2a or a right eye display device 2b can be viewed to be magnified to a user.

A left eye LE of a user can be arranged in the left eye ocular lens 20a, and a right eye RE of a user can be arranged in the right eye ocular lens 20b.

Referring to FIG. 8c, a head mounted display device of an augmented reality (AR) structure according to the present disclosure includes a left eye display device 2a, a lens array 16, a left eye ocular lens 20a, a transmissive reflection unit 18, and a transmissive window 19. Although only a structure for a left eye is shown in FIG. 8c for convenience, a structure for a right eye is the same as the structure for the left eye.

The left eye display device 2a, the lens array 16, the left eye ocular lens 20a, the transmissive reflection unit 18, and the transmissive window 19 are stored in the aforementioned storage case 15.

The left eye display device 2a can be arranged at one side of the transmissive reflection unit 18, for example, at an upper side, without covering the transmissive window 19. Therefore, the left eye display device 2a can provide the transmissive reflection unit 18 with an image without covering an outer background viewed through the transmissive window 19.

The left eye display device 2a can be comprised of an electroluminescence display device according to FIGS. 1 to 7 described above. In this case, the top portion corresponding to the surface where images are displayed in FIGS. 1 to 7, for example, the encapsulation layer 12 or the color filter 13 faces the transmissive reflection unit 18.

The lens array 16 can be provided between the left eye ocular lens 20a and the transmissive reflection unit 18.

A left eye of a user is arranged in the left eye ocular lens 20a.

The transmissive reflection unit 18 is arranged between the lens array 16 and the transmissive window 19. The transmissive reflection unit 18 can include a reflection surface 18a which transmits a portion of light and reflects another portion of light. The reflection surface 18a is formed to make an image displayed on the left eye display device 2a to proceed to the lens array 16. Therefore, the user can view all of images displayed on the left eye display device 2a and an outer background through the transmissive window 19. That is, since the user can view one image by overlapping background in reality with virtual images, augmented reality (AR) can be embodied.

The transmissive window 19 is arranged in front of the transmissive reflection unit 18.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A display device comprising:
a substrate including a first subpixel;
a first electrode including a first sub electrode provided on the first subpixel;
an organic light emitting layer including first and second organic light emitting layers arranged on the first sub electrode;
a second electrode arranged on the organic light emitting layer; and
an auxiliary electrode arranged between the first organic light emitting layer on the first sub electrode and the second organic light emitting layer on the first sub electrode,
wherein the auxiliary electrode is electrically connected with the second electrode.

2. The display device of claim 1, further comprising a first passivation layer arranged between the auxiliary electrode on the first sub electrode and the second organic light emitting layer on the first sub electrode.

3. The display device of claim 2, wherein the first passivation layer electrically insulates the auxiliary electrode from the second electrode.

4. The display device of claim 1, wherein the substrate further includes a second subpixel adjacent to the first subpixel,
the first electrode includes a second sub electrode provided on the second subpixel on the substrate, and
the organic light emitting layer includes a second organic light emitting layer arranged on the second sub electrode.

5. The display device of claim 4, wherein the second organic light emitting layer on the first sub electrode and the second organic light emitting layer on the second sub electrode are connected with each other.

6. The display device of claim 2, further comprising a second passivation layer provided to cover the second electrode.

7. The display device of claim 1, further comprising a voltage supply portion for supplying a voltage to the second electrode,
wherein the auxiliary electrode is connected to the voltage supply portion.

8. The display device of claim 4, wherein the substrate further includes a third subpixel adjacent to the first subpixel,
the first electrode includes a third sub electrode provided on the third subpixel on the substrate,
the organic light emitting layer includes a second organic light emitting layer arranged on the third sub electrode, and
the second organic light emitting layer arranged on the first sub electrode, the second organic light emitting layer arranged on the second sub electrode and the second organic light emitting layer arranged on the third sub electrode are connected with one another.

9. The display device of claim 8, further comprising:
a first bank provided between the first sub electrode and the second sub electrode, and partitioning the first subpixel from the second subpixel; and
a second bank provided between the first sub electrode and the third sub electrode, and partitioning the first subpixel from the third subpixel,
wherein the second electrode is provided to cover the first bank, the second bank and the second organic light emitting layer.

10. The display device of claim 9, further comprising:
a first passivation layer arranged between the auxiliary electrode on the first sub electrode and the second organic light emitting layer on the first sub electrode; and
a second passivation layer provided to cover the second electrode.

11. The display device of claim 8, further comprising:
a first color filter arranged on the second subpixel; and a second color filter arranged on the third subpixel,
wherein the first color filter filters light to emit green light, and the second color filter filters light to emit red light.

12. The display device of claim 4, wherein the substrate further includes a third subpixel adjacent to the first subpixel,
the first subpixel, the second subpixel and the third subpixel are arranged in a first direction, and
the first subpixel, the second subpixel and the third subpixel are provided to respectively emit blue light, green light and red light.

13. The display device of claim 12, wherein the substrate further includes a fourth subpixel adjacent to the first subpixel in a second direction vertical to the first direction, a fifth subpixel adjacent to the second subpixel in the second direction, and a sixth subpixel adjacent to the third subpixel in the second direction,
the first subpixel and the fourth subpixel are provided to emit light of a same color,
the second subpixel and the fifth subpixel are provided to emit light of a same color, and
the third subpixel and the sixth subpixel are provided to emit light of a same color.

14. The display device of claim 13, wherein the first electrode includes a fourth sub electrode provided on the fourth subpixel on the substrate,
the first sub electrode and the second sub electrode are spaced apart from each other at a first interval,
the first sub electrode and the fourth sub electrode are spaced apart from each other at a second interval, and
the second interval is equal to or narrower than the first interval.

15. The display device of claim 13, wherein the fourth subpixel comprises a first organic light emitting layer, a second organic light emitting layer and an auxiliary electrode arranged between the first organic light emitting layer and the second organic light emitting layer, and
the auxiliary electrode in the first subpixel and the auxiliary electrode in the fourth subpixel are arranged in one stripe pattern in the second direction.

16. The display device of claim 8, further comprising a voltage supply portion for supplying a voltage to the second electrode,
wherein the voltage supply portion includes a plurality of protrusions protruded toward the second subpixel and the third subpixel, and
the second electrode is connected to the voltage supply portion by allowing the second electrode to be in contact with only the plurality of protrusions.

17. The display device of claim 8, further comprising a voltage supply portion for supplying a voltage to the second electrode,
wherein the voltage supply portion is divided into a plurality of voltage supply portions corresponding to the first subpixel, the second subpixel and the third subpixel respectively.

18. The display device of claim 7, wherein the auxiliary electrode is connected to the voltage supply portion by using at least one of a contact method using a laser welding, a contact method using a partition structure, and a contact method using an under-cut structure.

19. The display device of claim 1, further comprising:
a lens array spaced apart from the substrate; and
a storage case storing the substrate and the lens array.

20. A display device comprising:
a substrate provided with a first subpixel;
a first electrode including a first sub electrode provided on the first subpixel;
an organic light emitting layer including first and second organic light emitting layers arranged on the first sub electrode;
a second electrode arranged on the organic light emitting layer; and
an auxiliary electrode arranged between the first organic light emitting layer on the first sub electrode and the second organic light emitting layer on the first sub electrode,
wherein the auxiliary electrode and the second electrode are connected to a voltage supply portion.

* * * * *